(12) United States Patent
Ode et al.

(10) Patent No.: US 6,232,941 B1
(45) Date of Patent: May 15, 2001

(54) LIQUID CRYSTAL DISPLAY DEVICE

(75) Inventors: Yukihide Ode, Mobara; Akira Ogura, Nagara-machi; Kentaro Agata, Mobara; Kazunari Kurokawa, Mobara; Takahiro Fujioka, Mobara; Hiroshi Katayanagi; Mitsuru Goto, both of Chiba, all of (JP)

(73) Assignees: Hitachi, Ltd., Tokyo; Hitachi Device Engineering Co., Ltd., Mobara, both of (JP)

( * ) Notice: Subject to any disclaimer, the term of this patent is extended or adjusted under 35 U.S.C. 154(b) by 0 days.

(21) Appl. No.: 09/165,742

(22) Filed: Oct. 5, 1998

(30) Foreign Application Priority Data

Oct. 6, 1997 (JP) .................................................. 9-272299

(51) Int. Cl.$^7$ ...................................................... G09G 3/36
(52) U.S. Cl. .............................. 345/95; 345/89; 345/210; 345/211
(58) Field of Search .................................. 345/87, 92, 95, 345/90, 204, 210

(56) References Cited

U.S. PATENT DOCUMENTS

| | | | |
|---|---|---|---|
| 4,737,782 | * | 4/1988 | Fukuma et al. .......................... 345/51 |
| 5,196,738 | * | 3/1993 | Takahara et al. ....................... 327/530 |
| 5,414,443 | * | 5/1995 | Kanatani et al. ........................ 345/95 |
| 5,623,278 | * | 4/1997 | Okada et al. ............................ 345/95 |
| 5,726,676 | * | 3/1998 | Callahan, Jr. et al. ................. 345/98 |
| 5,796,379 | * | 8/1998 | Enomoto et al. ....................... 345/89 |
| 5,877,736 | * | 3/1999 | Imajo et al. ............................. 345/89 |
| 5,953,002 | * | 9/1999 | Hirai et al. ............................. 345/204 |

* cited by examiner

Primary Examiner—Richard Hjerpe
Assistant Examiner—Kevin M. Nguyen
(74) Attorney, Agent, or Firm—Antonelli, Terry, Stout & Kraus, LLP

(57) ABSTRACT

A liquid crystal display device is capable of generating gradation voltages for multilevel gradation, such as 256-level gradation, without increasing the chip size of video signal line driving means. The video signal line driving means for applying video signal voltages for multilevel gradation in accordance with m-bit display data is provided with a first gradation voltage generator for generating ($2^n$+1) first gradation voltages, a selector for selecting first gradation voltages adjacent to each other out of ($2^n$+1) first gradation voltages generated by the first gradation voltage generator in accordance with the bit values of high-order n bits of the m-bit display data, while keeping the magnitude relationship between the ($2^n$+1) first gradation voltages unchanged, and a second gradation voltage generator for generating and outputting one of $2^{m-n}$ gradation voltages dividing first gradation voltages adjacent to each other into $2^{m-n}$ voltages from the first gradation voltages adjacent to each other selected by the selector in accordance with the bit values of low-order (m-n) bits of the display data.

7 Claims, 19 Drawing Sheets

|   | D1 | d0 | onSW | output |
|---|---|---|---|---|
| a | 0 | 0 | S1 | Va |
| b | 0 | 1 | S2, S3 | $Va + 1/4 \Delta V$ |
| c | 1 | 0 | S3, S5 | $Va + 2/4 \Delta V$ |
| d | 1 | 1 | S2, S4 | $Va + 3/4 \Delta V$ |

LIQUID CRYSTAL DISPLAY DEVICE

BACKGROUND

The present invention relates to a liquid crystal display device used for a personal computer or a work station, particularly to a technique to be effectively applied to a video signal line driving circuit (drain driver) of a liquid crystal display enabling multilevel gradation display.

An active-matrix liquid crystal display having an active element (e.g., thin film transistor) for each pixel and switching the active element is widely used as a display of a notebook computer. Because in the active-matrix liquid crystal display a video signal voltage (gradation voltage) is applied to a pixel electrode through an active element, there is no crosstalk between pixels, it is unnecessary to use a special driving method for preventing crosstalk unlike a passive-matrix liquid crystal display, and multilevel gradation display is possible.

A TFT liquid crystal display module provided with a TFT (Thin Film Transistor) liquid crystal display panel (TFT-LCD), a drain driver provided on the upper side of the liquid crystal display panel, and a gate driver and an interface section provided on the side of the liquid crystal display panel is known as one of active-matrix liquid crystal displays.

The TFT liquid crystal display module has a multilevel gradation voltage generation circuit in the drain driver and moreover has a gradation voltage selection circuit for selecting a gradation voltage corresponding to display data out of multilevel gradation voltages generated by the multilevel gradation voltage generation circuit in order to realize multilevel gradation display. This technique is disclosed in Japanese Patent Application No. 86668/1996.

In general, the gradation voltage selection circuit in the drain driver has a transistor group for selecting gradation voltages of multilevel gradation generated by the multilevel gradation voltage generation circuit in the drain driver, whose gate electrode is provided with a transistor group to whose electrodes the bit values of display data are applied.

For example, the gradation voltage generation circuit generates gradation voltages of 64 levels. Moreover, when assuming the gradation voltage generation circuit to be a decoder circuit to which bit values and their inverted bit values of 6-bit display data are input, 12 transistors are cascade-connected to the gradation voltage selection circuit for each of 64 levels of gradation.

Meanwhile, in the case of a liquid crystal display, multilevel gradation display has been further progressed from 64-level gradation display to 256-level gradation display in recent years.

Moreover, to display a picture of such a multilevel gradation on a liquid crystal display panel, the gradation voltage selection circuit in the drain drive requires 16 transistors for each of 256 levels of gradation. Therefore, there are problems that the area occupied by the gradation voltage selection circuit increases and the chip size of the semiconductor integrated circuit (IC chip) constituting the drain driver increases.

Furthermore, in the case of a liquid crystal display such as a TFT liquid crystal display module, the display screen is further increased in scale and therefore, the display screen size tends to be increased. Furthermore, to eliminate unnecessary spaces and improve the fine appearance of the display, it is demanded to minimize the region other than the display region of the display, that is, minimize the frame portion of the display (frame minimization).

However, when the area occupied by the gradation voltage selection circuit increases and the chip size of the semiconductor integrated circuit (IC chip) constituting the drain driver increases, there arises a problem that these increases cannot deal with the frame minimization.

The present invention has been made to solve the above conventional problems and its object is to provide a technique making it possible that a liquid crystal display generates gradation voltages of more gradations such as 256 gradations without increasing the chip size of video signal line driving means.

The above object and novel features of the present invention will become apparent from the description of this specification and accompanying drawings.

SUMMARY OF THE INVENTION

The outline of typical ones of the inventions disclosed in this application will be briefly described below.

A liquid crystal display provided with a liquid crystal panel having a plurality of pixels and a driving circuit for applying a video signal voltage to each of the pixels in accordance with display data, wherein the driving circuit has a first circuit for outputting two voltages in accordance with one display data value and a second circuit for outputting one of a plurality of voltages generated from the two voltages.

A liquid crystal display provided with a liquid crystal panel having a plurality of pixels arranged like a matrix and a driving circuit for applying a video signal voltage to each of the pixels in accordance with display data, wherein the driving circuit has a first circuit for outputting a first voltage and a second voltage in accordance with one display data value, a second circuit for receiving the first and second voltages and outputting one of a plurality of voltages generated from the first and second voltages, and a switch circuit for switching input terminals of the second circuit to which the first and second voltages are input.

A liquid crystal display provided with a liquid crystal panel having a plurality of pixels arranged like a matrix and a driving circuit for applying a video signal voltage to each of the pixels in accordance with display data, wherein the driving circuit has a first circuit for outputting a first voltage and a second voltage in accordance with first display data and outputting the first voltage and a third voltage in accordance with second display data and a second circuit for receiving two voltages output by the first circuit and outputting one of a plurality of voltages generated from two voltages output by the first circuit.

A liquid crystal display provided with a liquid crystal panel having a plurality of pixels arranged like a matrix and a driving circuit for applying a video signal voltage to each of the pixels in accordance with m-bit display data, wherein the driving circuit has a first voltage generation circuit for generating $(2n+1)$ (where $2 \leq n \leq m$) first gradation voltages and a second voltage generation circuit for receiving two voltages output by the first voltage generation circuit in accordance with high-order n-bit data of the m-bit display data and outputting one of a plurality of voltages generated from two voltages outputted by the first voltage generation circuit in accordance with low-order (m-n)-bit data of the m-bit display data.

A liquid crystal display provided with a liquid crystal panel having a plurality of pixels arranged like a matrix and a driving circuit for applying a video signal voltage to each of the pixels in accordance with m-bit display data, wherein the driving circuit has a first voltage generation circuit for generating (2n+1)(where 2≦n≦m) first gradation voltages and outputting two voltages in accordance with high-order n-bit data of the m-bit display data, a second voltage generation circuit for receiving two voltages, outputted by the first voltage generation circuit at a first input terminal and a second input terminal and outputting one of a plurality of voltages generated from two voltages outputted by the first voltage generation circuit in accordance with low-order (m-n)-bit data of the m-bit display data, and a switch circuit for connecting the output of the first voltage generation circuit to the first and second input terminals.

DETAILED DESCRIPTION OF THE PREFERRED EMBODIMENTS

Figure 1:
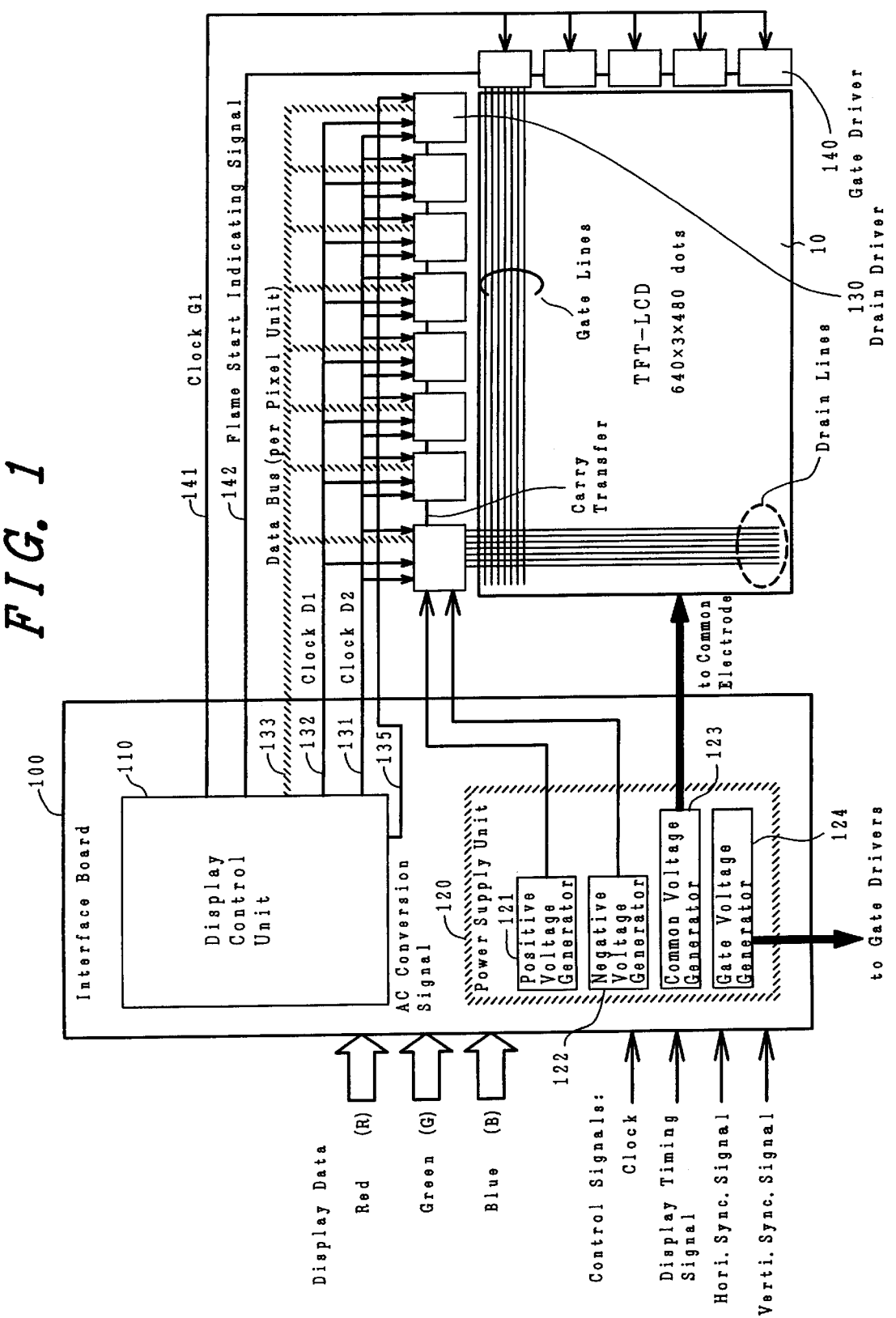
FIG. 1 is a block diagram showing the schematic structure of a TFT liquid crystal display module of an embodiment of the present invention.

Embodiments of the present invention will be described below referring to the accompanying drawings.

In the drawings illustrating the embodiments of the present invention, components having the same function are denoted by the same symbol and their repetitive description will be omitted.

FIG. 1 is a block diagram showing the schematic structure of a TFT liquid crystal display of an embodiment of the present invention.

In the case of the liquid crystal display (LCM) of this embodiment, a drain driver 130 is provided on the upper side of a liquid crystal display panel (TFT-LCD) 10 and a gate driver 140 and an interface section 100 are arranged on the side of the liquid crystal display panel 10.

The interface section 100 is mounted on an interface board and the drain driver 130 and the gate driver 140 are also respectively mounted on exclusive printed circuit boards.

Figure 2:
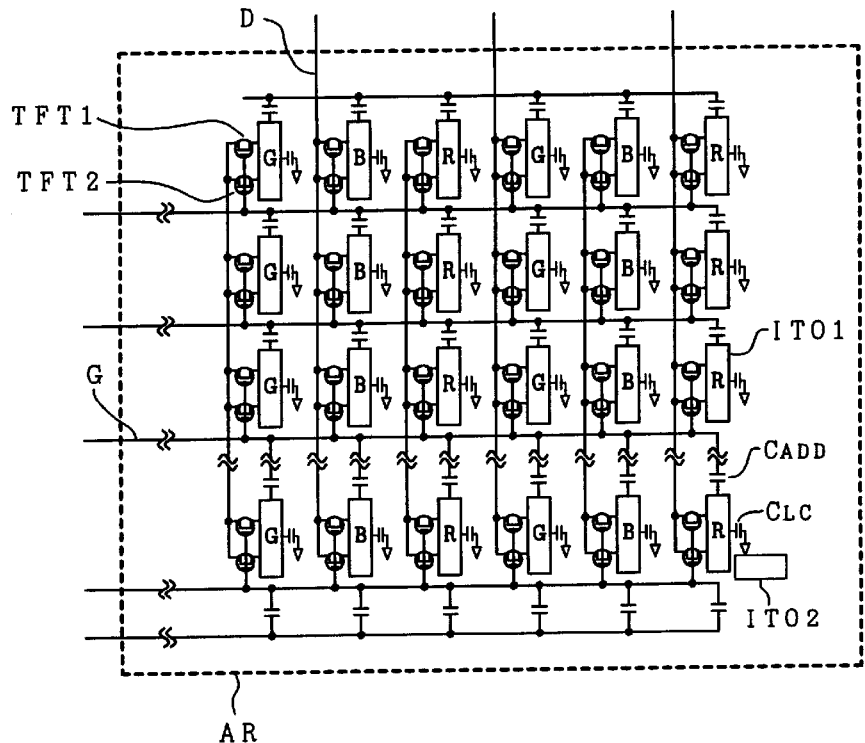
FIG. 2 is an illustration showing an equivalent circuit of an example of the liquid crystal display panel shown in FIG. 1.

FIG. 2 is an illustration showing an equivalent circuit of an example of the liquid crystal display panel 10 shown in FIG. 1.

Though FIG. 2 is a circuit diagram, it is drawn correspondingly to the actual geometric arrangement, in which the liquid crystal display panel 10 has a plurality of pixels formed like a matrix.

Each pixel is disposed in an intersectional region defined by two adjacent signal lines (drain signal lines (D) or gate signal lines (G)) and two adjacent signal lines (gate signal lines (G) or drain signal lines (D)).

Each pixel has thin film transistors (TFT1 and TFT2), source electrodes of the thin film transistors (TFT1 and TFT2) of each pixel are connected to a pixel electrode (IT01), and a liquid crystal layer (LC) is formed between the pixel electrode (IT01) and a common electrode (IT02). Therefore, a liquid crystal capacitor (CLC) is equivalently connected between the source electrodes of the thin film transistors (TFT1 and TFT2) and the common electrode (IT02).

Moreover, an additional capacitor (CADD) is connected between the source electrodes of the thin film transistors (TFT1 and TFT2) and the gate signal line (G) of the preceding stage.

Figure 3:
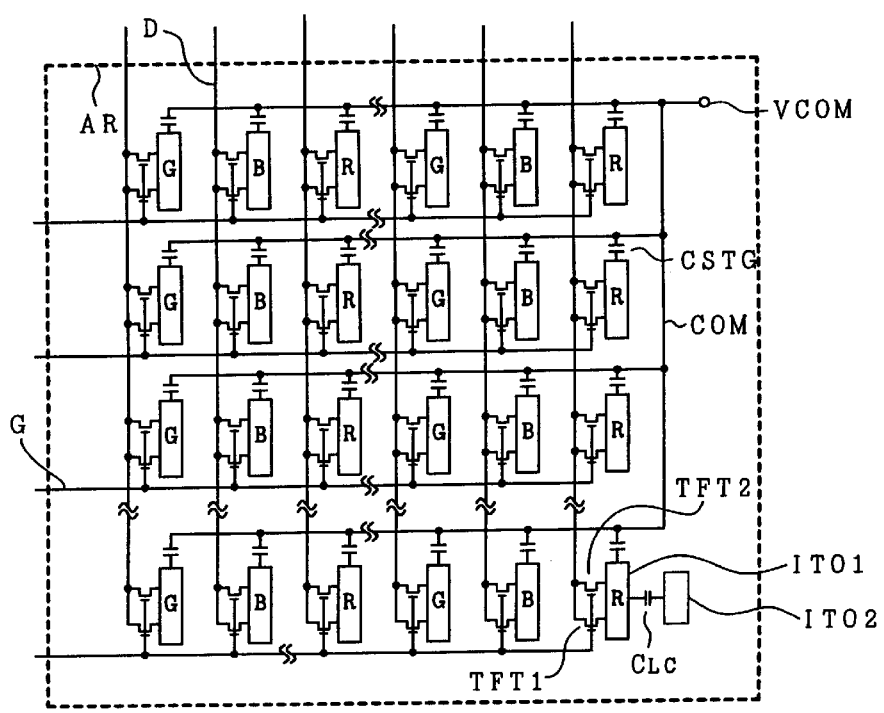
FIG. 3 is an illustration showing an equivalent circuit of another example of the liquid crystal display panel shown in FIG. 1.

FIG. 3 is an illustration showing an equivalent circuit of another example of the liquid crystal display panel 10 shown in FIG. 1.

In the case of the example shown in FIG. 2, an additional capacitor (CADD) is provided between the gate signal line (G) of the preceding stage and the source electrodes. However, in the case of the equivalent circuit of another example shown in FIG. 3, it is different in that a holding capacitor (CSTG) is provided between a common signal line (COM) and a source electrode.

The present invention can be applied to the both panels. In the case of the former system, pulses of the gate signal (G) of the preceding stage enter the pixel electrode (IT01) through the additional capacitor (CADD). In the case of the latter system, however, more preferable display can be made because no pulse enters the pixel electrode (IT01). Moreover, in FIGS. 2 and 3, symbol AR denotes a display region.

In the case of the liquid crystal display panel 10 shown in FIGS. 2 or 3, the drain electrodes of thin film transistors (TFT1 and TFT2) of each pixel arranged in the column direction are connected to a drain signal line (D), and the drain signal line (D) is connected to the drain driver 130 for applying a video signal voltage (display data voltage) to the liquid crystal of each pixel in the column direction.

Moreover, the gate electrodes of the thin film transistors (TFT1 and TFT2) of each pixel arranged in the row direction are connected to a gate signal line (G), and the gate signal line (G) is connected to the gate driver 140 for supplying a scan driving voltage (positive bias voltage or negative bias voltage) to the thin film transistors (TFT1 and TFT2) of each pixel in the row direction for one horizontal scanning period. In this case, the liquid crystal display panel 1 shown in FIG. 1 is constituted of 640×3×480 pixels.

The interface section 100 shown in FIG. 1 is constituted of a display controller 110 and a power supply circuit 120.

The display controller 110 is constituted of one semiconductor integrated circuit (LSI), and controls and rivers the drain driver 130 and gate driver 140 in accordance with display control signals such as a clock signal, display timing signal, horizontal sync signal, and vertical sync signal sent from the main body side of a computer and display data (R.G.B).

Then the display controller 110 receives a display timing signal, it judges the signal to be a display start position and outputs received display data of simple one column to the drain driver 130 through a bus line 133 of display data.

In this case, the display controller 110 outputs a display data latching clock (D2) serving as a display control signal for latching display data to the data latched circuit of the drain driver 130 through a signal line 131.

The display data sent from the main body computer side is transferred in units of a pixel, that is, in sets of data on red (R), green (G), and blue (B) in a unit cycle. In this case, the display data is constituted of 18 bits (6 bits for each color).

When the input of a display timing signal is completed or a predetermined certain time passes after the display timing signal is inputted, the display controller 110 judges that the display data for one horizontal line has been completed and outputs an output timing control clock (D1) serving as a display control signal for outputting the display data stored in the latch circuit of the drain driver 130 to the drain signal line (D) of the liquid crystal display panel 10 to the drain driver 130 through a signal line 132.

Moreover, when the display controller 110 receives a first display timing signal after receiving a vertical sync signal, it judges the first display timing signal to be a first display line and outputs a frame start instruction signal to the gate driver 140 through a signal line 142.

Furthermore, the display controller 110 outputs a clock (G1) serving as a shift clock of one horizontal scanning period to the gate driver 140 through a signal line 141 so as to successively apply a positive bias voltage to each signal line (G) of the liquid crystal display panel 10 every horizontal scanning period in accordance with a horizontal sync signal.

Hence, a plurality of thin film transistors (TFT1 and TFT2) connected to each gate signal line (G) of the liquid crystal display panel 10 are turned on for one horizontal scanning period. According to the above operations, an image is displayed on the liquid crystal display panel 10.

The power supply circuit 20 shown in FIG. 1 is constituted of a positive voltage generation circuit 121, a negative voltage generation circuit 122, a common electrode (facing-electrode) voltage generation circuit 123, and a gate electrode voltage generation circuit 124.

The positive voltage generation circuit 121 and the negative voltage generation circuit 122 are each constituted of a series resistance-type potential dividing circuit. The positive voltage generation circuit 121 outputs five-level negative-polarity gradation reference voltages ($V''0$ to $V''4$) and the negative voltage generation circuit 122 outputs five-level negative-polarity gradation reference voltages ($V''5$ to $V''9$). The positive-polarity gradation reference voltages ($V''0$ to $V''4$) and the negative-polarity gradation reference voltages ($V''5$ to $V''9$) are supplied to each drain driver 130. Moreover, a dc/ac converting signal (dc/ac converting timing signal; M) is supplied from the display controller 110 to each drain driver 130 through a signal line 135.

The common electrode voltage generation circuit 123 generates a driving voltage to be applied to the common electrode (IT02), and the gate electrode voltage generation circuit 124 generates driving voltages (positive bias voltage and negative bias voltage) to be applied to the thin film transistors (TFT1 and TFT2).

In general, when the same voltage (DC voltage) is applied to a liquid crystal layer (LC) for a long time, the tilt of the liquid crystal layer (LC) is fixed and as a result, the afterimage phenomenon occurs and the service life of the layer (LC) is shortened.

To prevent the above phenomenon, a conventional liquid crystal display converts a video signal voltage to be applied to the liquid crystal layer (LC) to ac every certain time, that is, changes a video signal voltage to be applied to the pixel electrode (IT01) to the positive voltage side and the negative voltage side every certain time on the basis of the video signal voltage of the common electrode (IT02).

The common symmetry method and common inverting method are known as driving methods for applying an AC voltage to the liquid crystal layer (LC). The common symmetry method is a method of keeping the voltage to be applied to the common electrode (IT02) constant and alternately inverting the voltage to be applied to the pixel electrode (IT01) to the positive voltage and the negative voltage on the basis of the voltage to be applied to the common electrode (IT02).

The common symmetry method has a disadvantage that the amplitude of the voltage to be applied to the pixel electrode (IT01) becomes twofold compared to the case of the common inverting method and a low-voltage driver cannot be used. However, the dot inverting method or the V-line inverting method excellent in terms of small power consumption and display quality can be used. In the liquid crystal display of this embodiment, the dot inverting method is used as its driving method.

Figure 4:
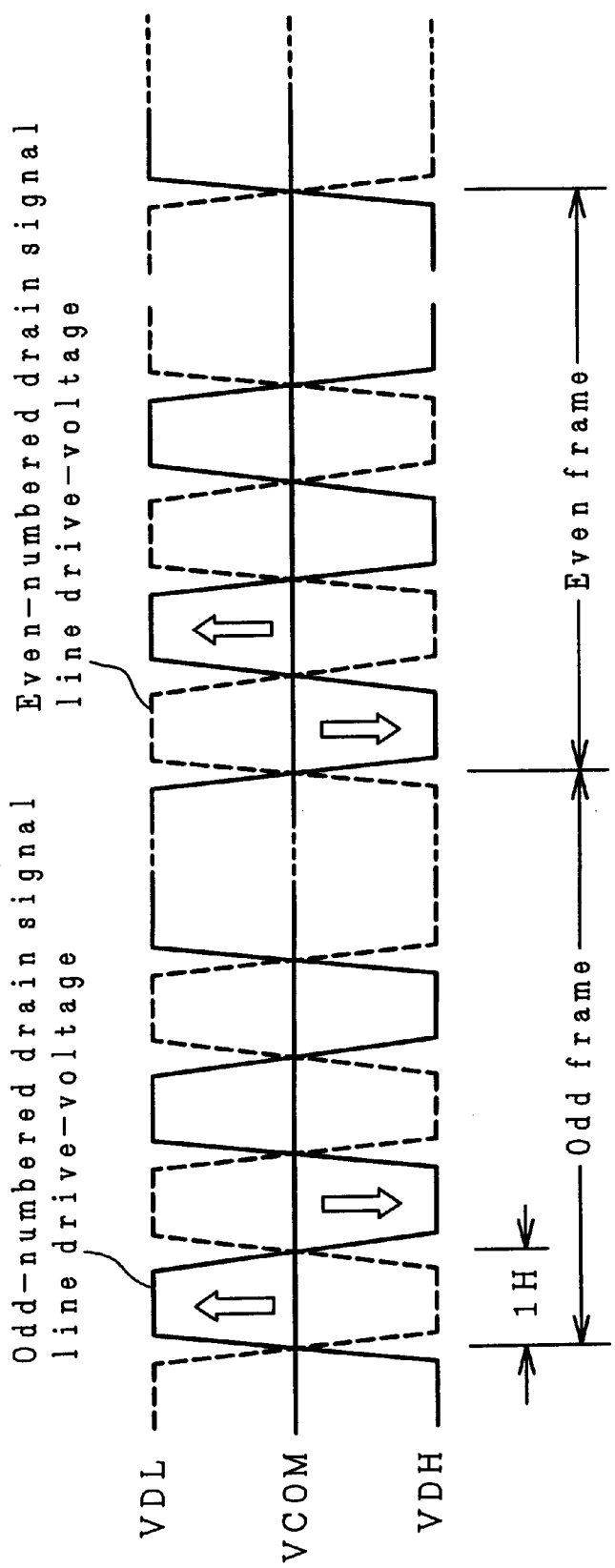
FIG. 4 is an illustration showing the relation between the liquid crystal driving voltage outputted to a drain signal line (D) from the drain driver shown in FIG. 1, that is, the liquid crystal driving voltage applied to a pixel electrode (IT01) and the liquid crystal voltage applied to a common electrode (IT02)

FIG. 4 is an illustration showing the relation between the video signal voltage to be output to a drain signal line (D) from the drain driver 130 shown in FIG. 1, that is, the video signal voltage to be applied to the pixel electrode (IT01) and the video signal voltage to be applied to the common electrode (IT02).

In FIG. 4, the video signal voltage to be outputted to a drain signal line (D) from the drain driver 130 is a video signal voltage when displaying black on the display screen of the liquid crystal display panel 10.

As shown in FIG. 4, a video signal voltage (VDH) to be output to the odd drain signal line (D) from the drain driver 130 and a video signal voltage (VDL) to be output to the even drain signal line (D) from the drain driver 130 have a polarity opposite to that of the driving voltage (VCOM) to be applied to the common electrode (IT02), that is, when the video signal voltage (VDH) to be output to the odd drain signal line (D) has a positive polarity (or negative polarity), the video signal voltage (VDL) to be output to the even drain signal line (D) has a negative polarity (or positive polarity). Moreover, the polarity is inverted every line. Furthermore, the polarity for each line is inverted every frame.

By using the dot inverting method, voltages to be applied to adjacent drain signal lines (D) have polarities opposite to each other. Therefore, the currents flowing through the common electrode (IT02) and gate electrode (G) offset each other and thus, it is possible to reduce the power consumption.

Furthermore, because the current flowing through the common electrode (IT02) is small and the voltage drop does not become large, the voltage level at the common electrode (IT02) is stabilized and the deterioration of display quality can be minimized.

Figure 5:
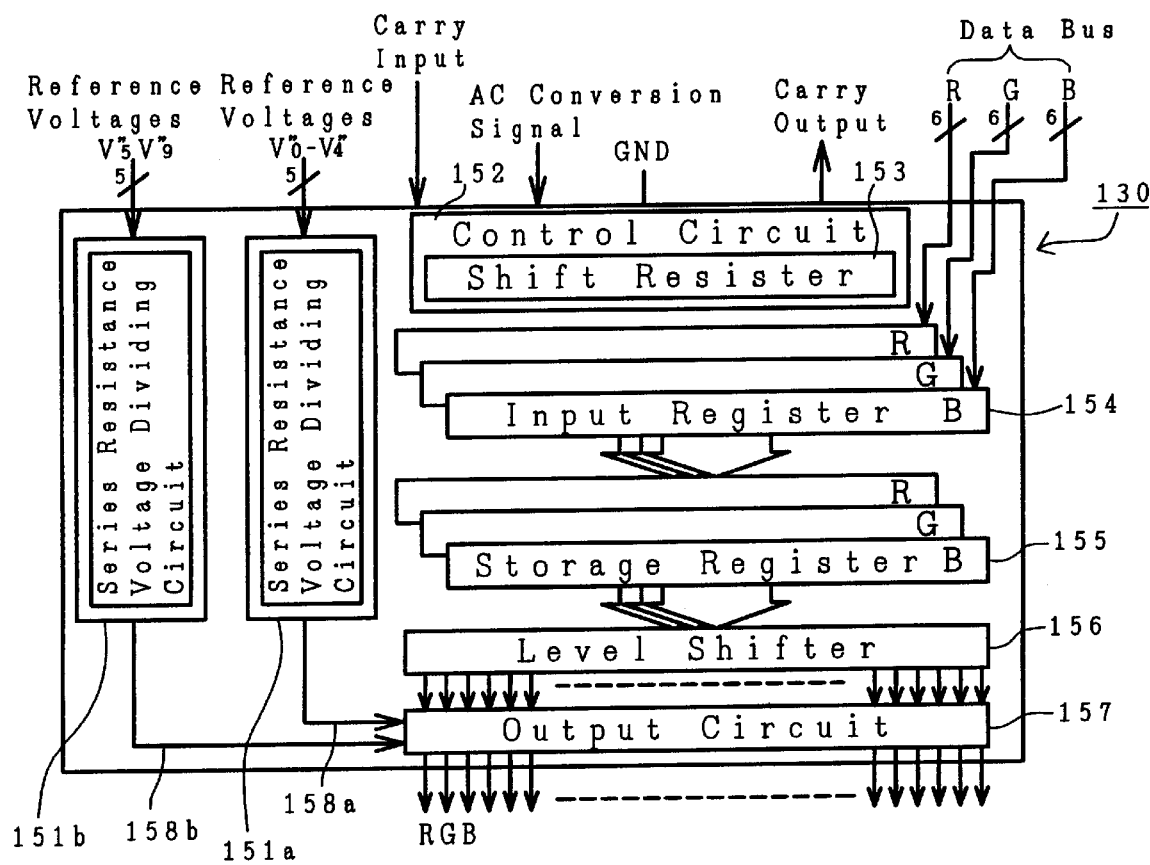
FIG. 5 is a block diagram showing the schematic structure of an example of the drain driver shown in FIG. 1.

FIG. 5 is a block diagram showing the schematic structure of an example of the drain driver 130 shown in FIG. 1. The drain driver 130 is constituted of one semiconductor integrated circuit (LSI).

In FIG. 5, a positive-polarity gradation voltage generation circuit 151a generates positive-polarity gradation voltages for 64-level gradation in accordance with five-level positive-polarity gradation reference voltage (V"0 to V"4) inputted from the positive voltage generation circuit 121 and outputs the voltages to an output circuit 157 through a voltage bus line 158a. A negative-polarity gradation voltage generation circuit 151b generates negative-polarity gradation voltages for 64-level gradation in accordance with negative-polarity five-value gradation reference voltages (V"5 to V"9) inputted from the negative voltage generation circuit 122 and outputs the voltages to the output circuit 157 through a voltage bus line 158b.

Moreover, a shift register circuit 153 in a control circuit 152 of the drain driver 130 generates a signal for capturing the data in an input register circuit 154 in accordance with a display data latching clock (D2) inputted from the display controller 110 and outputs the signal to the input register circuit 154.

The input register circuit 154 latches 6-bit display data for each color synchronously with the display data latching clock (D2) in accordance with a data capturing signal outputted from the shift register circuit 153.

A storage register circuit 155 latches the display data in the input register circuit 154 correspondingly to an output timing control clock (D1) inputted from the display controller 110. The display data captured by the storage register circuit 155 is inputted to an output circuit 557 through a level shift circuit 156.

The output circuit 157 selects one gradation voltage corresponding to display data out of positive-polarity gradation voltages for 64-level gradation or negative-polarity gradation voltages for 64-level gradation and outputs the voltage to each drain signal line (D).

Figure 6:
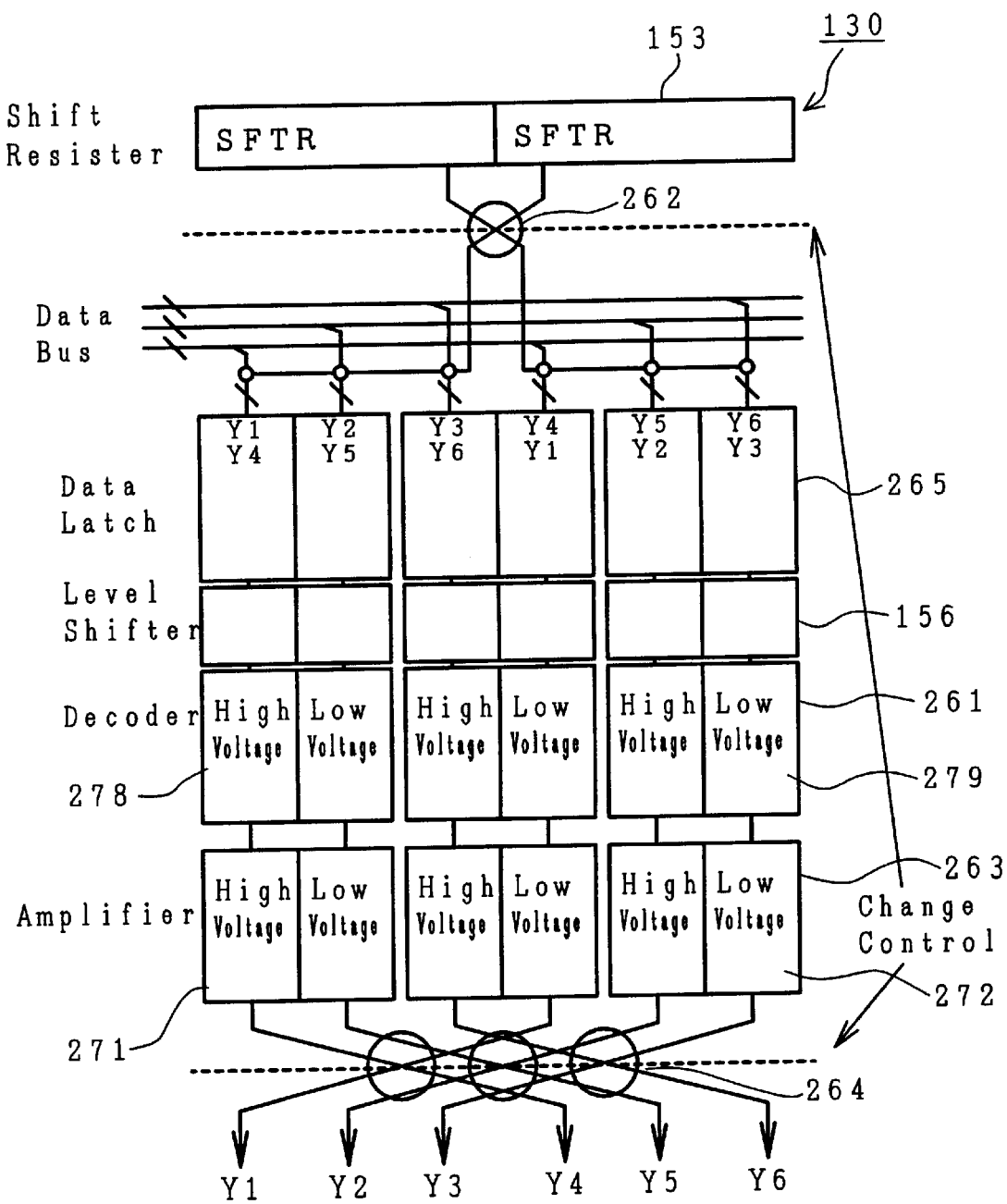
FIG. 6 is a block diagram for illustrating the structure of an example of the drain driver shown in FIG. 5.

FIG. 6 is a block diagram illustrating the structure of the drain driver 130 shown in FIG. 5, mainly the structure of the output circuit 157.

In FIG. 6, numeral 153 denotes a shift register circuit in the control circuit 152 shown in FIG. 5 and 156 denotes the level shift circuit shown in FIG. 5. A data latching section 265 comprises the input register circuit 154 and storage register circuit 155 shown in FIG. 5. Moreover, a decoder section (gradation voltage selection circuit) 261, an amplifier circuit pair 263, and a switching section (2) 264 for switching the outputs of the amplifier circuit pair 263 constitute the output circuit 157 shown in FIG. 5.

In this case, a switching section (1) 262 and the switching section (2) 264 are controlled by a dc/ac converting signal (M). Moreover, symbols Y1, Y2, Y3, Y4, Y5, and Y6 denote first, second, third, fourth, fifth, and sixth drain signal lines (D).

The drain driver 130 shown in FIG. 6 switches data-capturing signals inputted to the data latching section 265 (more specifically, the input register 154 shown in FIG. 5) by the switching section (1) 262 and inputs display data for each color to the mutually adjacent data latching sections 265 for respective colors.

The decoder section 261 is constituted of a high-voltage decoder circuit 278 for selecting a gradation voltage corresponding to the display data outputted from the data latching sections 265 (more specifically, the storage register 155 shown in FIG. 5) out of positive-polarity gradation voltages for 64-level gradation outputted from the gradation voltage generation circuit 151a through the voltage bus line 158a and a low-voltage decoder circuit 279 for selecting a gradation voltage corresponding to the display data outputted from the data latching sections 265 out of negative-polarity gradation voltages for 64-level gradation outputted from the gradation voltage generation circuit 151b through the voltage bus line 158b. The high-voltage decoder circuit 278 and low-voltage decoder circuit 279 are provided for every adjacent data latching sections 265.

The amplifier circuit pair 263 is constituted of a high-voltage amplifier circuit 271 and a low-voltage amplifier circuit 272. The positive-polarity gradation voltage selected by the high-voltage decoder circuit 278 is inputted to the high-voltage amplifier circuit 271, which outputs a positive-polarity video signal voltage. The negative-polarity gradation voltage selected by the low-voltage decoder circuit 279 is inputted to the low-voltage amplifier circuit 272, which outputs a negative-polarity video signal voltage.

In the dot inverting method, video signal voltages of adjacent colors have polarities opposite to each other and moreover, the high-voltage amplifier circuit 271 and the low-voltage amplifier circuit 272 of the amplifier circuit pair 263 are arranged in order of the high-voltage amplifier circuit 271, low-voltage amplifier circuit 272, high-voltage amplifier circuit 271, and low-voltage amplifier circuit 272. Therefore, it is possible to output a positive-polarity or negative-polarity video signal voltage to each drain signal line (D) by switching data capturing signals inputted to the data latching section 165 by the switching section (1) 262, inputting display data for each color to the mutually adjacent data latching sections 265 for respective colors, and correspondingly to the inputting, switching the output voltages outputted from the high-voltage amplifier circuit 271 or low-voltage amplifier circuit 272 by the switching section (2) 264, and outputting the voltage to drain signal lines (D) to which a video signal voltage for each color is outputted, such as the first drain signal line Y1 and the fourth drain signal line Y4.

Figure 7:
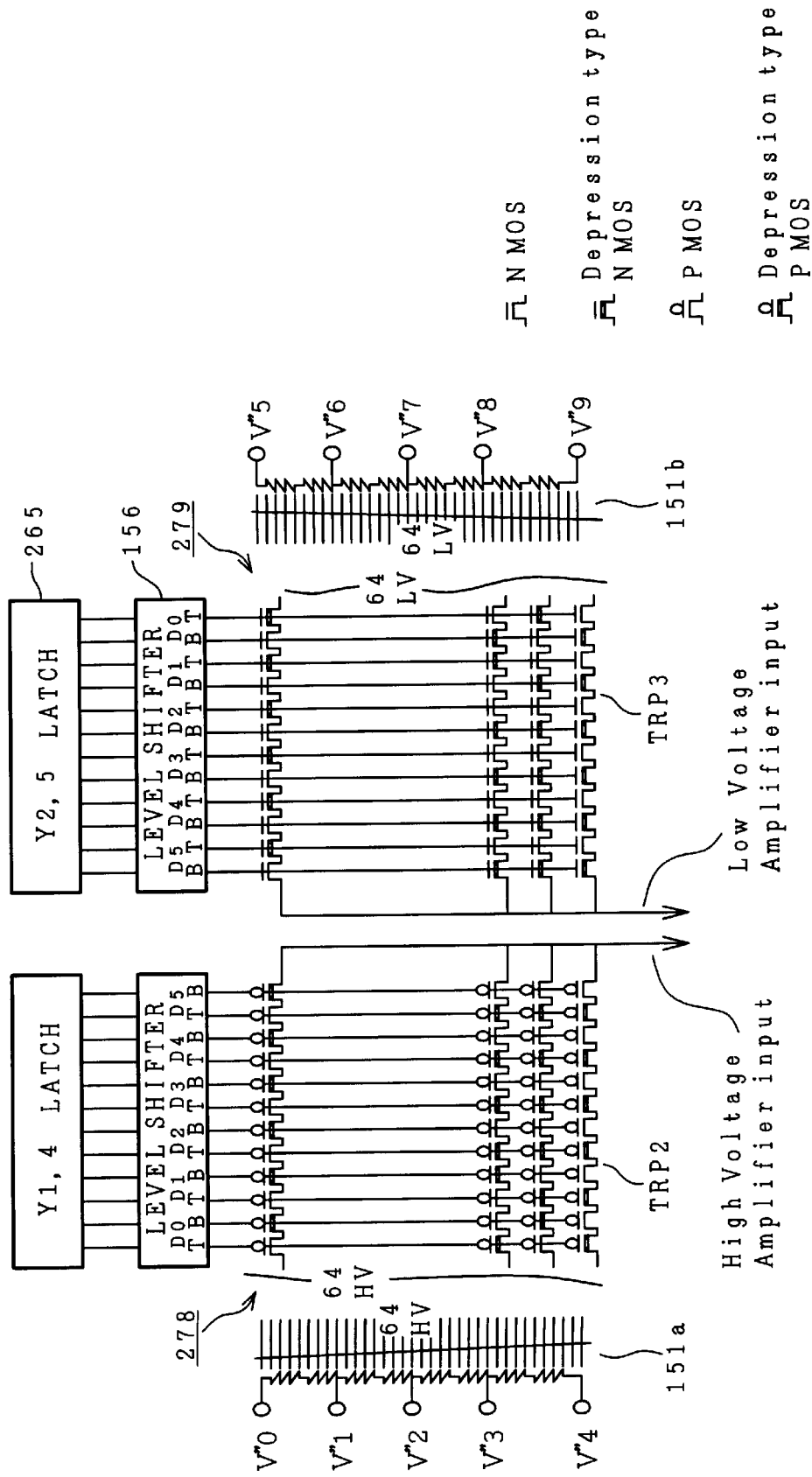
FIG. 7 is a circuit diagram showing the structures of a conventional high-voltage decoder circuit and low-voltage decoder circuit.

FIG. 7 is a circuit diagram showing structures of the conventional high-voltage decoder circuit 278 and the low-voltage decoder circuit 279. Moreover, FIG. 7 illustrates schematic structures of the positive-polarity gradation voltage generation circuit 151a and negative-polarity gradation voltage generation circuit 151b.

Figure 21:
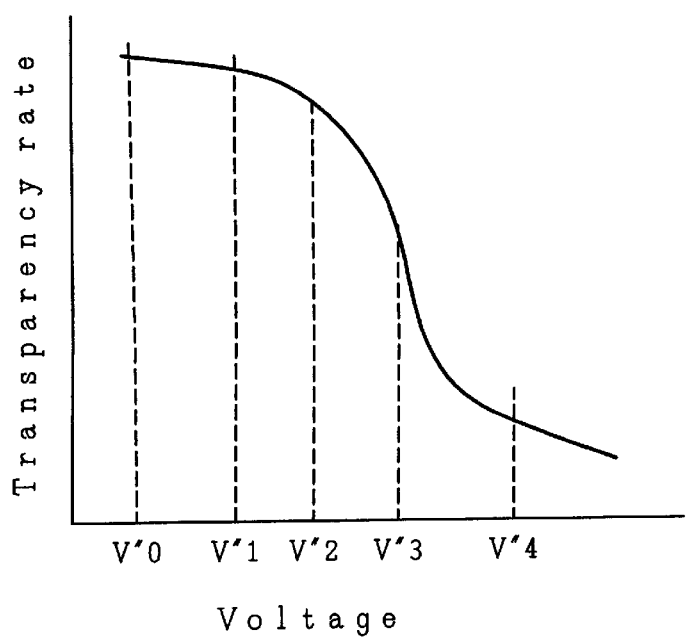
FIG. 21 is a graph showing the relation between the voltage applied to a liquid crystal layer and the transmittance.

As shown in FIG. 21, the relation between the voltage applied to the liquid crystal layer and the transmittance is not linear. The change of transmittance against the voltage applied to the liquid crystal layer is small at portions where the transmittance is high and low but and it is large at the intermediate portion.

Therefore, in the conventional positive-polarity gradation voltage generation circuit 151a or negative-polarity gradation voltage generation circuit 151b, the portions between the quinary gradation reference voltages (V"0 to V"4, V"5 to V"9) the differences between which are small in intermediate portions (V"2 to V"3, V"6 to V"8) and large in the portions (V"1 to V"2, V"3 to V"4, V"5 to V"6, V"8 to V"9) other than the intermediate portions and which are supplied from a power supply circuit are divided to generate 64 gradation voltages.

Thereby, an image of 64-level gradation which is almost linear is displayed on the liquid crystal display panel 10.

The high-voltage decoder circuit 278 has 64 transistor series (TRP2) constituted of six high-breakdown-voltage PMOS transistors and six high-breakdown-voltage depression PMOS transistors connected to the output terminals in series. Positive-polarity gradation voltages for 64 levels of gradation outputted from the gradation voltage generation circuit 151a through the voltage bus line 158a are inputted to terminals on the opposite side to the output terminals of the transistor series (TRP2).

Moreover, bit values (T) or their inverted bit values (B) of 6-bit display data outputted from the level shift circuit 156 are selectively applied to the gate electrodes of six high-breakdown-voltage PMOS transistors and six high-breakdown-voltage depression PMOS transistors constituting each of the transistor series (TRP2) in accordance with a predetermined combination.

The low-voltage decoder circuit 279 has 64 transistor series (TRP3) constituted of six high-breakdown-voltage NMOS transistors and six high-breakdown-voltage depression NMOS transistors connected to the output terminals in series. Negative-polarity gradation voltages for 64 levels of gradation outputted from the gradation voltage generation circuit 151b through the voltage bus line 158b are inputted to terminals on the opposite side to the output terminals of the transistors series (RP3).

Moreover, bit values (T) or their inverted bit values (B) of 6-bit display data outputted from the level shift circuit 156 are selectively applied to the gate electrodes of six high-breakdown-voltage NMOS transistors and six high-breakdown-voltage depression NMOS transistors constituting each of the transistor series (TP3) in accordance with a predetermined combination.

The high-voltage decoder circuit 278 and the low-voltage decoder circuit 279 are constituted by connecting six same-polarity MOS transistors and six same-polarity depression MOS transistors in series on the same signal line in accordance with a predetermined connective relation and electrically connecting a nonselected bit value (T) or inverted bit value (B) portion among bit values (T) or inverted bit values (B) of display data with the depression MOS transistors.

Thus, the conventional high-voltage decoder circuit 278 and low-voltage decoder circuit 279 are constituted so that 12 MOS transistors are dependent every 64 levels of gradation. Therefore, the total number of MOS transistors for each drain signal line (D) is 768 (64×12).

Recently, for liquid crystal displays, gradation display has been progressed from 64 to 256 levels of gradation. However, to perform 256-level gradation display by using a conventional high-voltage decoder circuit 278 and a low-voltage decoder circuit 279, the total number of MOS transistor for each drain signal line (D) is 4,096 (256×16).

Therefore, there is a problem that the area occupied by the decoder section 261 increases and the chip size of the semiconductor integrated circuit constituting the drain driver increases.

Figure 8:
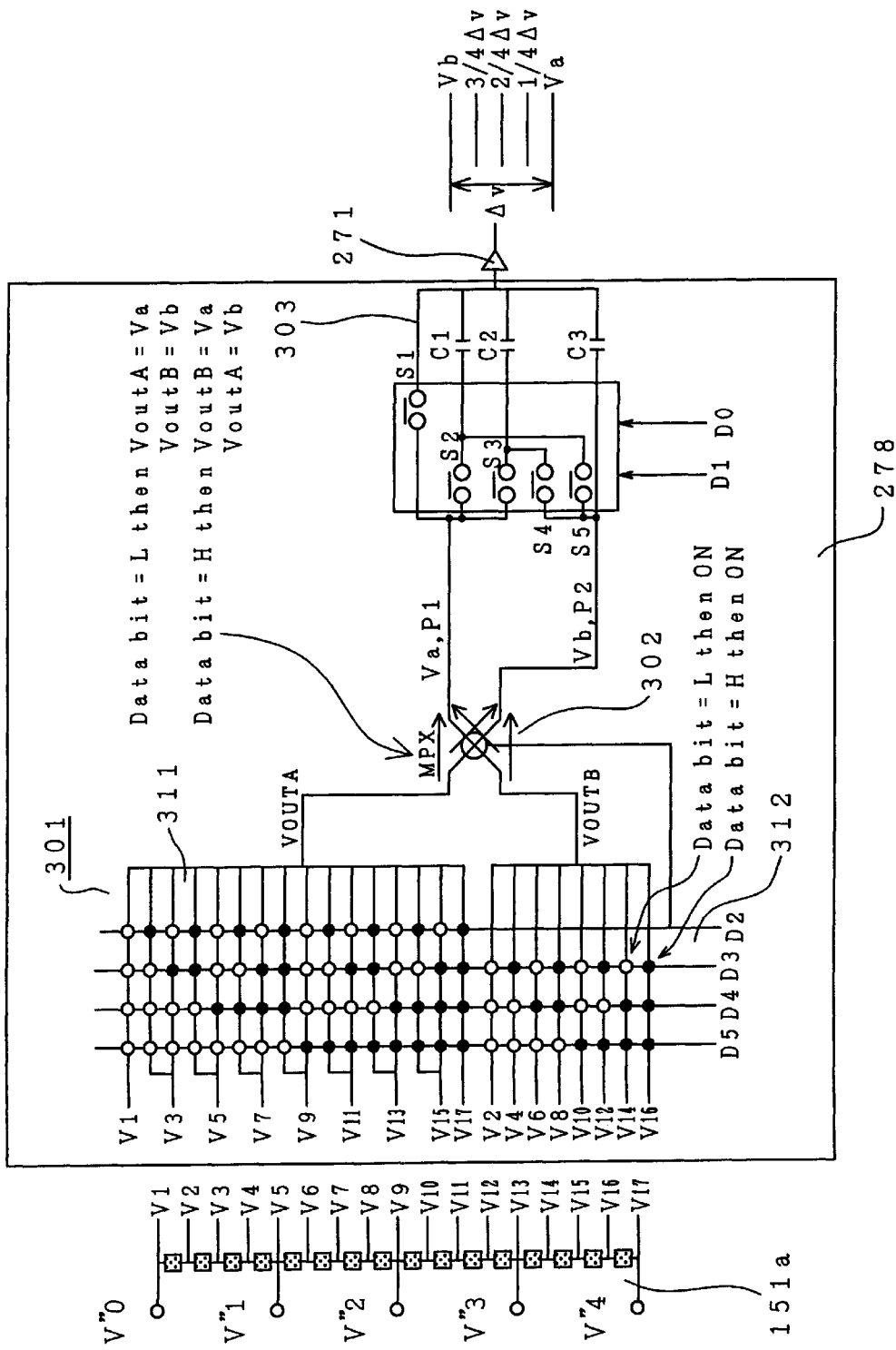
FIG. 8 is a circuit diagram showing the structures of the high-voltage decoder circuit and the positive-polarity gradation voltage generation circuit of an embodiment of the present invention.
Figure 9A:
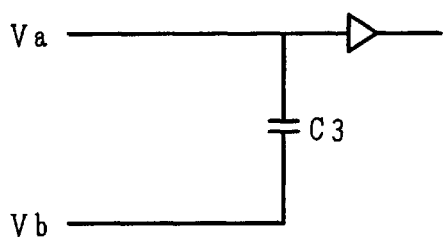
FIG. 9 is an illustration showing the on/off of the values of low-order two bits (D0 and D1) of display data in the capacitor voltage dividing circuit of an embodiment of the present invention.
Figure 9B:
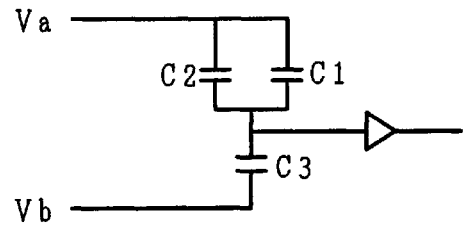
Figure 9C:
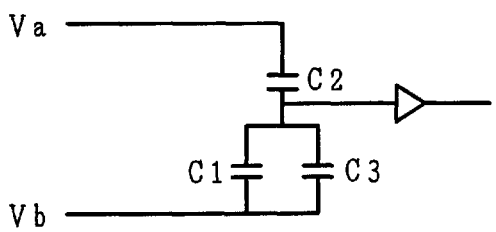
Figure 9D:
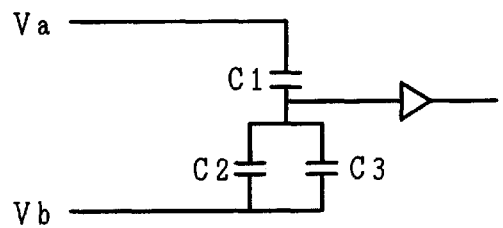

FIG. 8 is a circuit diagram showing the structures of the high-voltage decoder circuit 278 and positive-polarity gradation voltage generation circuit 151a of the liquid crystal display of an embodiment of the present invention.

As shown in FIG. 8, the positive-polarity gradation voltage generation circuit 151a does not generate 64 gradation voltages unlike the conventional example, but is generates first positive-polarity gradation voltages of 17-level gradation in accordance with the five-level positive-polarity gradation reference voltages (V"0 to V"4) inputted from the positive voltage generation circuit 121. In this case, each voltage dividing resistor of a resistance-type potential dividing circuit constituting the positive-polarity gradation voltage generation circuit 151a is weighted in a predetermined way correspondingly to the relation between the voltage applied to the liquid crystal layer and the transmittance.

The high-voltage decoder circuit 278 has a decoder circuit 301 for selecting first mutually adjacent gradation voltages (VOUTA and VOUTB) of first gradation voltages of 17-level gradation, a multiplexer 302 for outputting the first gradation voltage (VOUTA) selected by the decoder circuit 301 to a terminal (P1) or a terminal (P2) and outputting the first gradation voltage (VOUTB) selected by the decoder circuit 301 to a terminal (P2) or the terminal (P1), and a second gradation voltage generation circuit 303 for dividing the potential difference (Δ V) between the first gradation voltages (VOUTA and VOUTB) being adjacent to each other and outputted from the multiplexer 302 and generating voltages of ¼ΔV, ²⁄₄(=½)ΔV, ¾ΔV, and ⁴⁄₄(=1)ΔV.

The decoder circuit 301 is constituted of a first decoder circuit 311 for selecting first gradation voltages corresponding to high-order four bits (D2 to D5) of 6-bit display data out of the odd first gradation voltages and a second decoder circuit 312 for selecting first gradation voltages corresponding to high-order three bits (D3 to D5) of 6-bit display data out of the even first gradation voltages.

The first decoder circuit 311 is so constituted as to select the first first-gradation voltage (V1) and 17-th first-gradation voltage (V17) once and the third first-gradation voltage (V3) to 15-th first-gradation voltage (V15) twice consecutively according to the high-order four bits (D2 to D5) of 6-bit display data.

However, the second decoder circuit 312 is so constituted as to select the second first-gradation voltage (V2) to the 16-th first-gradation voltage (V16) once according to the high-order three bits (D3 to D5) of 6-bit display data.

In FIG. 8, symbol ○ denotes a switching device (e.g., PMOS transistor) which is turned on when the data bit is at a Low level (hereafter referred to as L level) and symbol ● denotes a switching element (e.g., NMOS transistor) which is turned on when the data bit is set at a High level (hereafter referred to as H level).

Table 1 shows the relation between the high-order four bits (D2 to D5) of 6-bit display data and the gradation voltages selected by the first decoder circuit 311 and the second decoder circuit 312.

TABLE 1

| D5 | D4 | D3 | D2 | VOUTA | VOUTB | P1 | P2 |
|----|----|----|----|-------|-------|----|----|
| 0 | 0 | 0 | 0 | V1 | V2 | V1 | V2 |
| 0 | 0 | 0 | 1 | V3 | V2 | V2 | V3 |
| 0 | 0 | 1 | 0 | V3 | V4 | V3 | V4 |
| 0 | 0 | 1 | 1 | V5 | V4 | V4 | V5 |
| 0 | 1 | 0 | 0 | V5 | V6 | V5 | V6 |
| 0 | 1 | 0 | 1 | V7 | V6 | V6 | V7 |
| 0 | 1 | 1 | 0 | V7 | V8 | V7 | V8 |
| 0 | 1 | 1 | 1 | V9 | V8 | V8 | V9 |
| 1 | 0 | 0 | 0 | V9 | V10 | V9 | V10 |
| 1 | 0 | 0 | 1 | V11 | V10 | V10 | V11 |
| 1 | 0 | 1 | 0 | V11 | V12 | V11 | V12 |
| 1 | 0 | 1 | 1 | V13 | V12 | V12 | V13 |
| 1 | 1 | 0 | 0 | V13 | V14 | V13 | V14 |
| 1 | 1 | 0 | 1 | V15 | V14 | V14 | V15 |
| 1 | 1 | 1 | 0 | V15 | V16 | V15 | V16 |
| 1 | 1 | 1 | 1 | V17 | V16 | V16 | V17 |

In this case, since V"0<V"1<V"2<V"3<V"4, as seen from Table 1, when the value of bit 3 (D2) of the display data is L-level, a gradation voltage lower than the gradation voltage VOUTB is outputted as the gradation voltage VOUTA. Moreover, when the value of bit 3 (D2) of the display data is H-level, a gradation voltage higher than the gradation voltage VOUTB is outputted as the gradation voltage VOUTA.

Therefore, the multiplexer 302 is switched correspondingly to the H level or L level of the value of bit 3 (D2) of the display data. That is, the gradation voltage VOUTA is outputted to the terminal (P1) when the value of the bit 3 (D2) of the display data is L-level; and the gradation voltage VOUTB is outputted to the terminal (P1) and the gradation voltage VOUTA is outputted to the terminal (P2) when the value of the bit 3 (D2) of the display data is H-level.

Thus, letting the gradation voltage of the terminal (P1) be (Va) and that of the terminal (P2) be (Vb), it is possible to satisfy the inequality Va<Vb and the design of the second gradation voltage generation circuit 303 is facilitated.

However, it is also possible to control data values (D1) and (D0) so as to generate a desired voltage without always using the multiplexer 302.

The second gradation voltage generation circuit 303 is constituted of a switching device (S1) connected between the terminal (P1) and the input terminal of the high-voltage amplifier circuit 271, a capacitor (C1) whose one end is connected to the input terminal of the high-voltage amplifier circuit 271 and whose the other end is connected to the terminal (P1) through a switching device (S2) and to the terminal (P2) through a switching device (S5), a capacitor (C2) whose one end is connected to the input terminal of the high-voltage amplifier circuit 271 and whose the other end is connected to the terminal (P1) through a switching device (S3) and to the terminal (P2) through a switching device (S4), and a capacitor (C3) connected between the terminal (P2) and the input terminal of the high-voltage amplifier circuit 271.

In this case, the capacitance of the capacitor (C1) is made equal to that of the capacitor (C3) and the capacitance of the capacitor (C2) is set to a value twices as large as those of the capacitor (C1) and capacitor (C3). Moreover, the switching devices (S1 to S5) are turned on/off in accordance with the values of the low-order two bits (D0 and D1) of display data as shown in FIG. 9. Furthermore, FIG. 9 shows the values of gradation voltages outputted from the second gradation voltage generation circuit 303 correspondingly to the values of the low-order two bits (D0 and D1) of the display data, and shows the structure of the second gradation voltage generation circuit 303 corresponding to the values of the low-order two bits (D0 and D1) of the display data.

Moreover, though a desired voltage is generated by a capacitor, it is also possible to generate a divided voltage between two voltages generated by a first generation circuit by using resistors. Furthermore, it is possible to generate a voltage between the two voltages by inserting a diode or a switching device.

The low-voltage decoder circuit 279 can be also constituted similarly to the high-voltage decoder circuit 278. In this case, the low-voltage decoder circuit 279 selects negative-polarity first gradation voltages for 17-level gradation generated from the negative-polarity gradation voltage generation circuit 151b.

Moreover, the negative-polarity gradation voltage generation circuit 151b generates negative-polarity first gradation voltages for 17-level gradation in accordance with the quinary negative-polarity first-gradation reference voltages (V"5 to V"9) inputted from the negative-voltage generation circuit 122, and moreover, each voltage-dividing resistor of a resistance-type potential dividing circuit constituting the negative-polarity gradation voltage generation circuit 151b is weighted in a predetermined way in accordance with the relation between the voltage applied to the liquid crystal layer and the transmittance.

In the low-voltage decoder circuit 279, since V"5>V"6>V"7>V"8>V"9, letting the gradation voltage of the terminal (P1) be (Va) and that of the terminal (P2) be (Vb), the inequality Va>Vb is always satisfied.

Thus, in the liquid crystal display of the embodiment of the present invention, the number of switching devices constituting a decoder circuit is 64 (=(9+7)×4) for the first decoder circuit 311, and 24(=(3×8)) for the second decoder circuit 312. Therefore, the total number of switching devices (MOS transistors) constituting a decoder circuit for each drain line (D) is 88. Thus, it is possible to greatly decrease the number of MOS transistors compared to the total number of 768 MOS transistors for each drain line (D) of the conventional example.

Moreover, by decreasing the number of switching devices, it is possible to reduce the internal current of the drain driver 130. Therefor, it is possible to reduce the entire power consumption of the liquid crystal display (LCM) and thereby, improve the reliability of the liquid crystal display (LCM).

Figure 10:
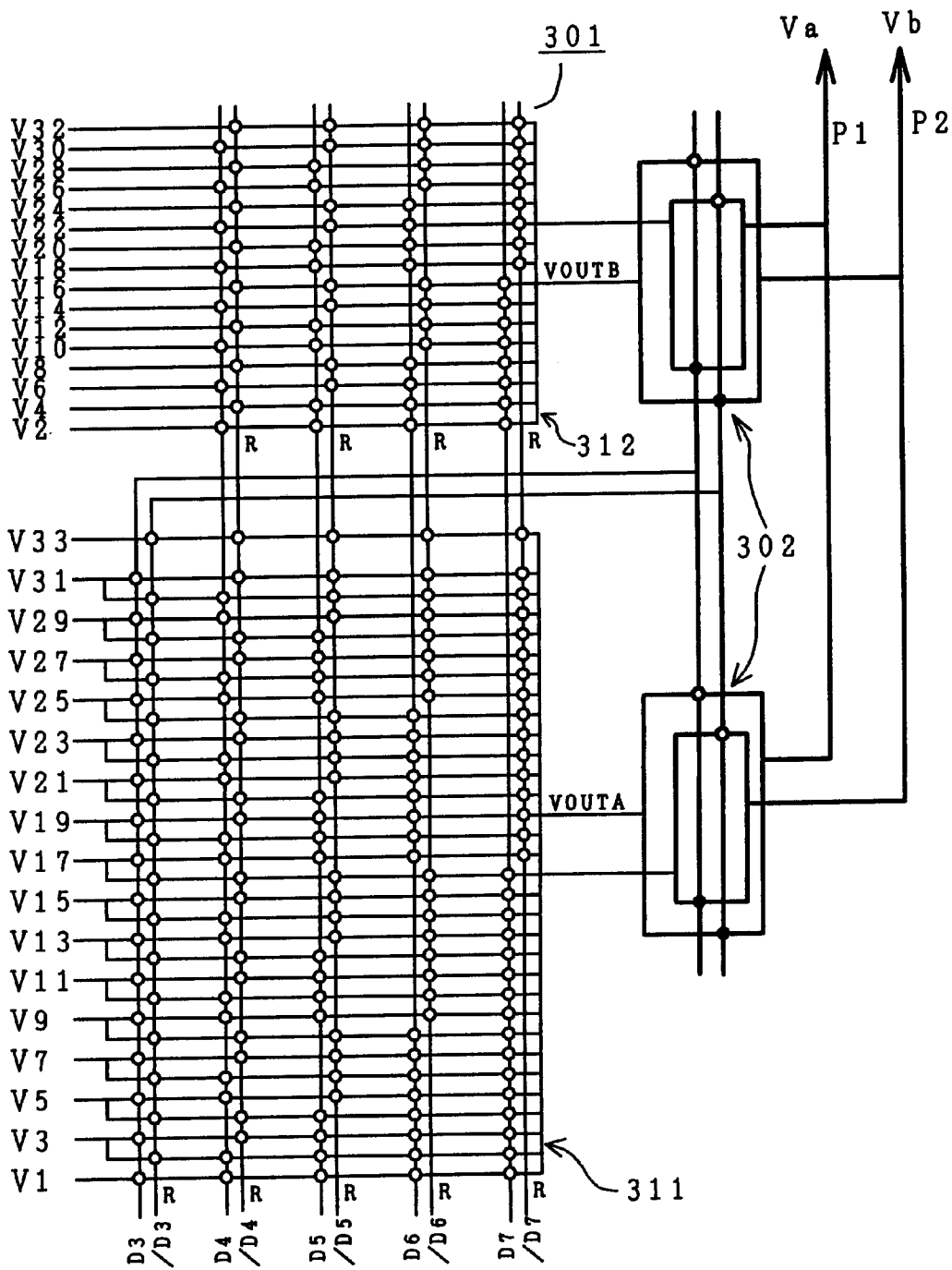
FIG. 10 is a circuit diagram showing the structure of another example of the high-voltage decoder circuit of an embodiment of the present invention.

FIG. 10 is a circuit diagram showing the structure of another example of the high-voltage decoder circuit 278 of the liquid crystal display of the embodiment of the present invention. FIG. 10 shows a circuit structure for generating gradation voltages for 256-level gradation by using PMOS transistors as switching devices. Therefore, the bit values and their inverted values of 8-bit display data values (D0 to D7) are applied to the gates of PMOS transistors in accordance with a predetermined combination.

The high-order five bits of the 8-bit display data are inputted to a decoder circuit 301 shown in FIG. 10. Therefore, a positive-polarity gradation voltage generation circuit 151a generates positive-polarity first gradation voltages for 33-level gradation in accordance with quinary positive-polarity gradation reference voltages (V"0 to V"4) inputted from a positive-voltage generation circuit 121. In this case, each dividing resistor of a resistance-type potential dividing circuit constituting the positive-polarity gradation voltage generation circuit 151a is weighted in a predetermined way in accordance with the relation between the voltage to be applied to the liquid crystal layer and the transmittance.

The decoder circuit 301 is constituted of a first decoder circuit 311 for selecting first gradation voltages corresponding to the high-order five bits (D3 to D7) of the 8-bit display data out of the odd first gradation voltages, and a second decoder circuit 312 for selecting first gradation voltages corresponding to the high-order four bits (D4 to D7) of the 8-bit display data out of the even first gradation voltages.

First gradation voltages (VOUTA and VOUTB) adjacent to each other of the first gradation voltages for 33-level gradation selected by the first decoder circuit 311 or second decoder circuit 312 in accordance with a combination of the values of the high-order five bits of the 8-bit display data are outputted to the terminal (P1) or terminal (P2) by a multiplexer 302.

In this case, the first decoder circuit 311 is so constituted as to select the first first-gradation voltage (V1) and the 33rd first-gradation voltage (V33) once and the third first-gradation voltage (V3) to the 31st first-gradation voltage (V31) twice consecutively by using the high-order five bits (D3 to D7) of the 8-bit display data. The second decoder circuit 312 is so constituted as to select the second first-gradation voltage (V2) to 32nd first-gradation voltage (V32) once by using the high-order four bits (D4 to D7) of the 8-bit display data. Moreover, in FIG. 10, symbol ○ denotes a PMOS transistor and symbol ● denotes an NMOS transistor.

The multiplexer 302 outputs the gradation voltage VOUTB to the terminal (P1) and the gradation voltage VOUTA to the terminal (P2) when the value of bit 4 (D3) of the 8-bit display data is L-level, and outputs the gradation voltage VOUTA to the terminal (P1) and the gradation voltage VOUTB to the terminal (P2) when the value of bit 4 (D3) of the display data is H-level. Thereby, letting the gradation voltage of the terminal (P1) be (Va) and that of the terminal (P2) be (Vb), it is possible to always satisfy the inequality Va<Vb.

Figure 11:
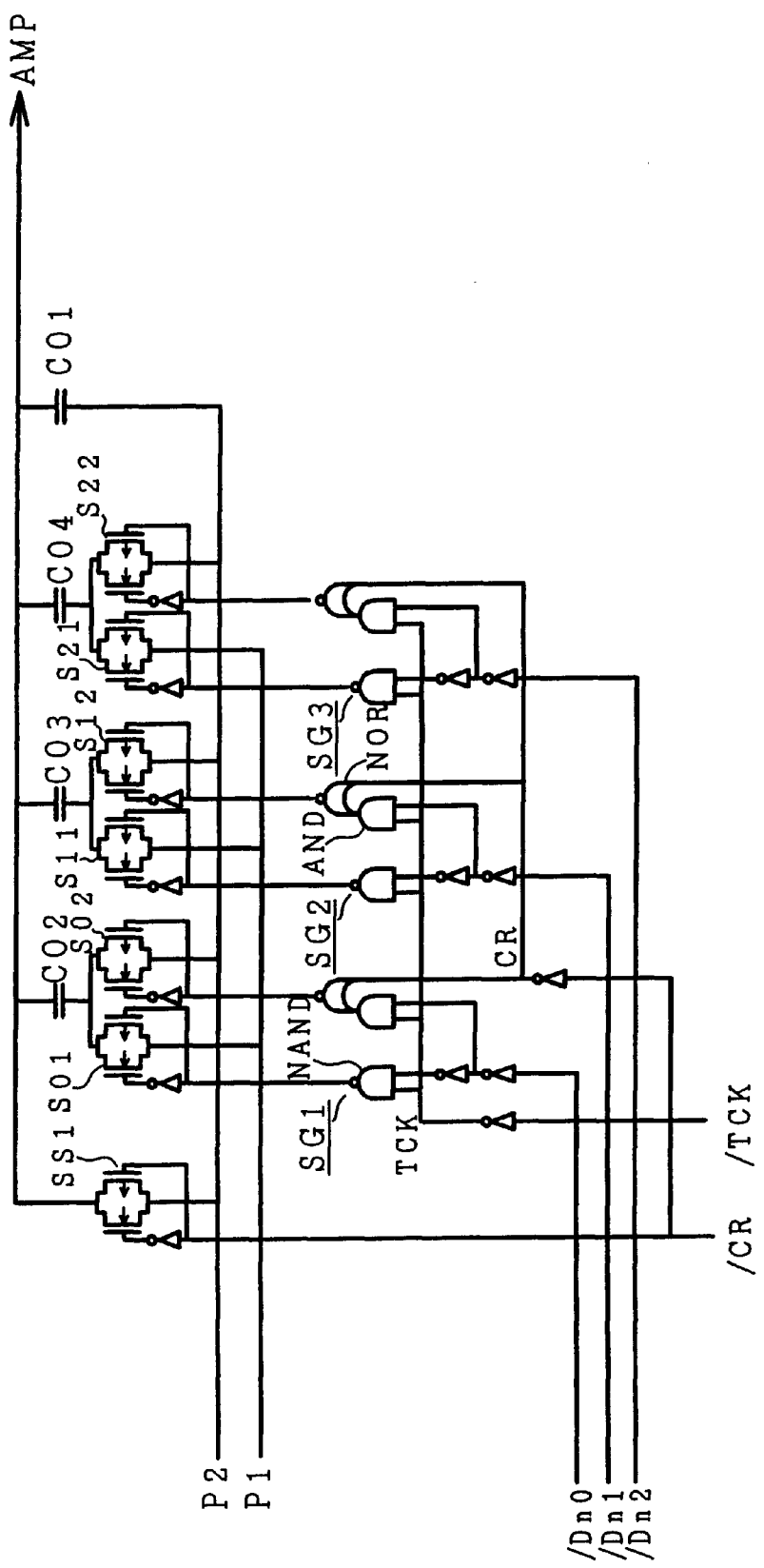
FIG. 11 is a circuit diagram showing an example of the structure of the capacitance-type potential dividing circuit of the high-voltage decoder circuit shown in FIG. 10.

FIG. 11 is a circuit diagram showing an example of the structure of a second gradation voltage generation circuit 303 of the high-voltage decoder circuit 278 shown in FIG. 10.

The second gradation voltage generation circuit 303 has a capacitor (Co1) connected between the terminal (P2) and the input terminal of the amplifier circuit (high-voltage amplifier circuit 271), a capacitor (Co2) whose one end is connected to the input terminal of the amplifier circuit and whose the other end is connected to the terminal (P1) through a switching device (S01) and to the terminal (P2) through a switching device (S02), a capacitor (Co3) whose one end is connected to the input terminal of the amplifier circuit and whose the other end is connected to the terminal (P1) through a switching device (S11) and to the terminal (P2) through a switching device (S12), a capacitor (Co4) whose one end is connected to the input terminal of the amplifier circuit and whose the other end is connected to the terminal (P1) through a switching device (S21) and to the terminal (P2) through a switching device (S22), and a switching device (SS1) connected between the terminal (P2) and the input terminal of the amplifier.

In this case, the capacitance of the capacitor (Co1) and that of the capacitor (Co2) are the same value, the capacitance of the capacitor (Co3) is twice as large as that of the capacitor (Co1), and the capacitance of the capacitor (Co4) is four times as large as that of the capacitor (Co1).

Moreover, as shown in FIG. 11, the switching device (SS1) is controlled by a reset pulse (/CR) and the switching devices (S01, S02, S11, S12, S21, and S22) are controlled by switching control circuits (SG1 to SG3) to which a reset pulse (/CR), a timing pulse (/TCK), and low-order three bits (D0 to D2) of the display data are inputted. Symbol/means that a signal of which the name is added with the symbol/is a low-enable signal.

Each of the switching control circuits (SG1 to SG3) is provided with a NAND circuit (NAND), and AND circuit (AND), and a NOR circuit (NOR). Table 2 is the truth table of the NAND circuit (NAND), the AND circuit (AND), and the NOR circuit (NOR).

TABLE 2

| /CR | /TCK | /D | NAND | AND | NOR | Sn1 | Sn2 |
|-----|------|----|------|-----|-----|-----|-----|
| L | H | * | H | L | L | OFF | ON |
| H | H | * | H | L | H | OFF | OFF |
| | | L | H | L | L | H | ON | OFF |
| | | L | H | H | H | L | OFF | ON |

Symbol * means that there is no relation with display data.

By using Table 2, the operation of the second gradation voltage generation circuit 303 will be briefly described below. First, when the reset pulse (/CR) is at the L level, the switching device (SS1) is turned on. Moreover, because the H-level reset pulse (/CR) is inputted to the NOR circuit (NOR), the output of the NOR circuit (NOR) becomes L-level and the switching devices (S02, S12, and S22) are turned on.

In this case, the timing pulse (/TCK) is at the H level and the L-level timing pulse (/TCK) is inputted to the NAND circuit (NAND). Therefore, the output of the NAND circuit (NAND) becomes H-level and the switching devices (S01, S11, and S21) are turned off. Thereby, the both ends of the capacitors (Co1 to Co4) are connected to the terminal (P2). Therefore, the capacitors (Co1 to Co4) are discharged and the potential difference between the capacitors is set to 0 V.

Then, when the reset pulse (/CR) becomes H-level and the timing pulse (/TCK) becomes L-level, the switching devices (S01, S02, S11, S12, S21, and S22) are turned on or off correspondingly to the values of low-order three bits (D0 to D2) of the display data.

Thereby, letting the gradation voltage of the terminal (P1) be (Va) and that of the terminal (P2) be (Vb), gradation voltages of Va+1/8Δ, Va+2/8Δ, . . . , and Vb (Va+8/8Δ) are outputted from the second gradation voltage generation circuit 302.

Moreover, it is possible to constitute the low-voltage decoder circuit 279 similarly to the high-voltage decoder circuit 278.

Thus, in the case of the high-voltage decoder circuit 278 shown in FIG. 10, the number of switching devices constituting a decoder circuit is 160 (=(17+15)×5) for the first decoder circuit 311 and 64 (=4×16) for the second decoder circuit 312. Therefore, the total number of switching devices (MOS transistors) constituting a decoder circuit for each drain signal line (D) is 224. Thus, it is possible to greatly decrease the number of MOS transistors compared to the total number of MOS transistors of 4,096 for each drain signal line (D) of the conventional example.

Figure 12:
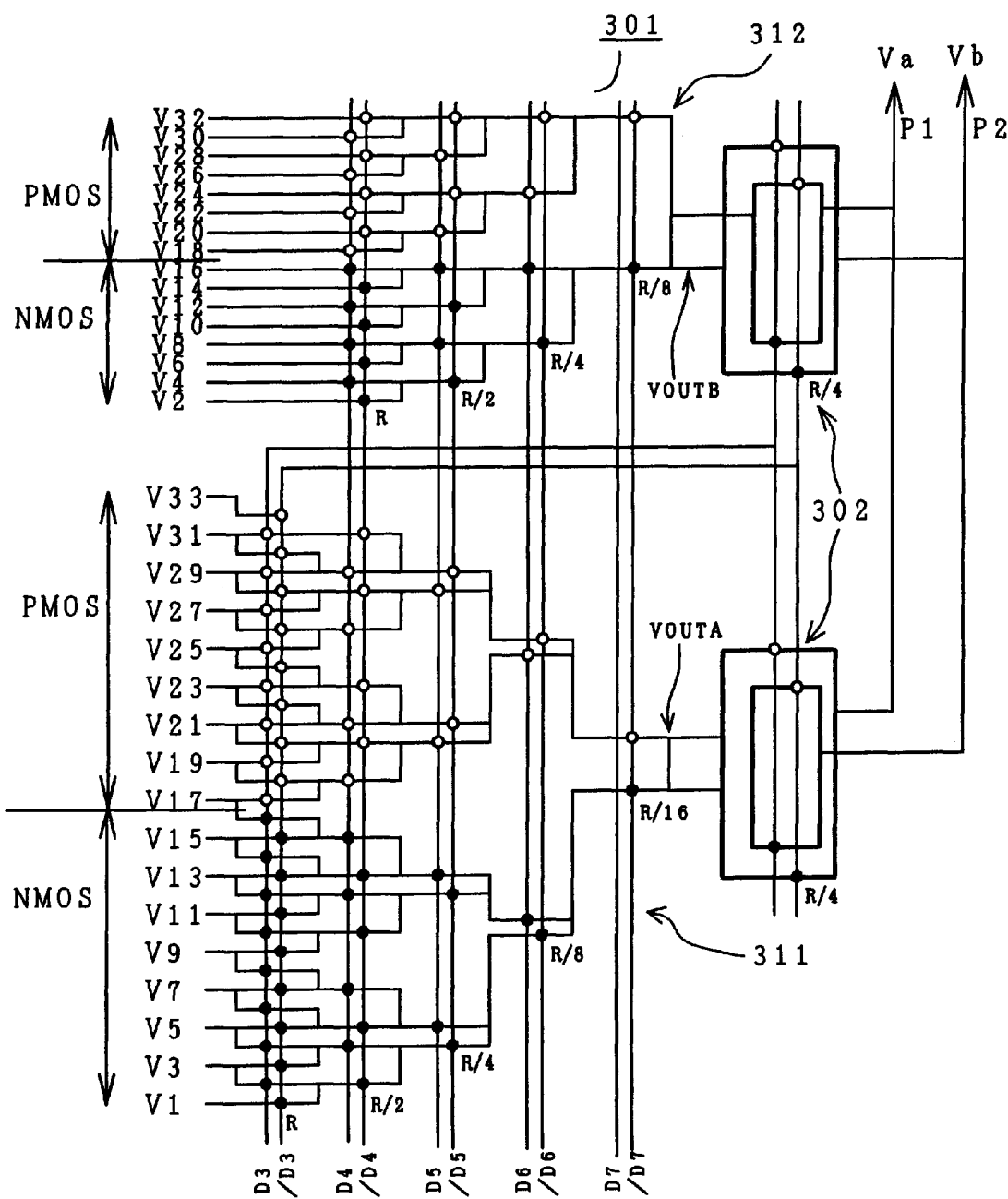
FIG. 12 is a circuit diagram showing the structure of the high-voltage decoder circuit of an embodiment of the present invention.
Figure 13:
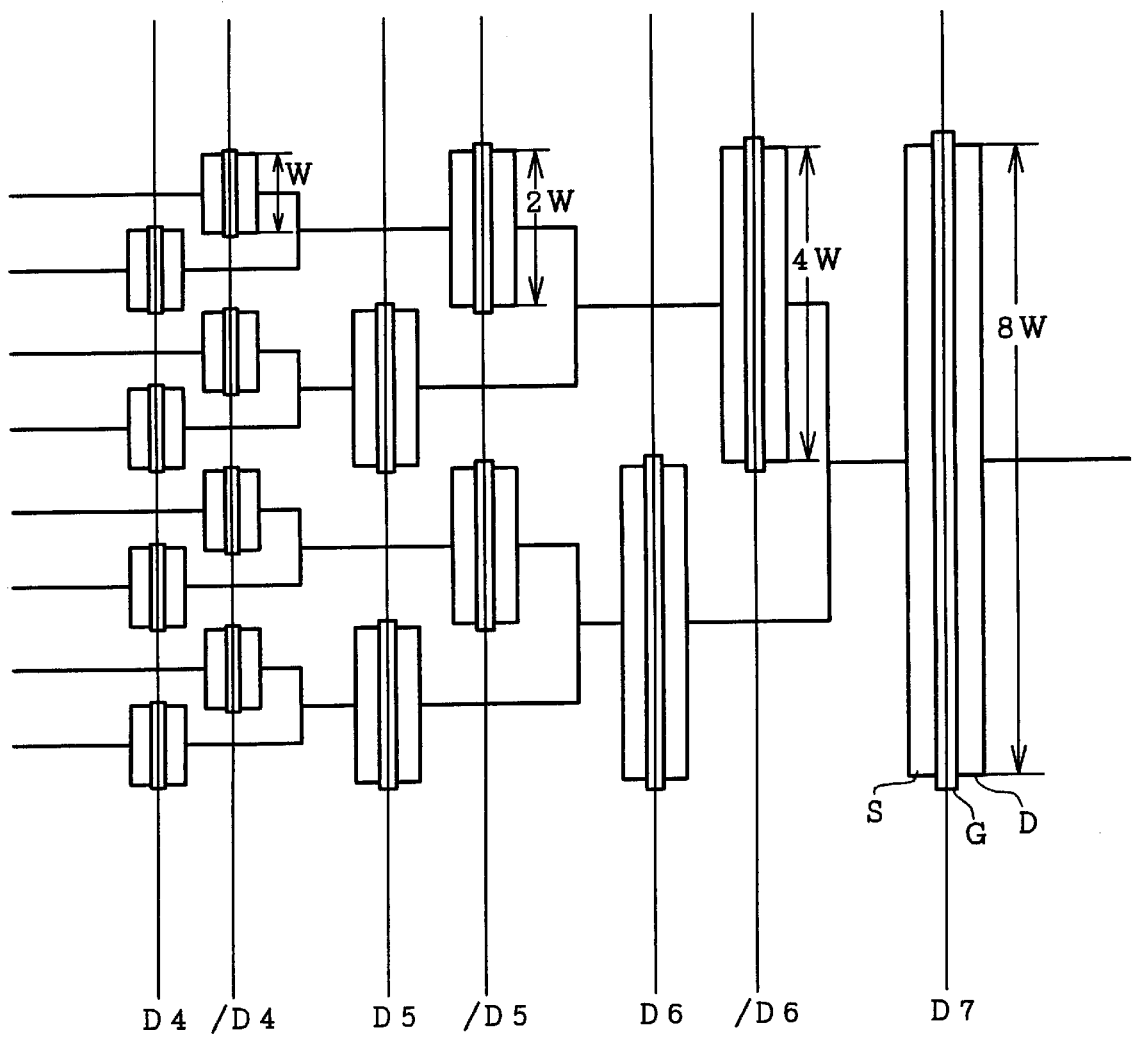
FIG. 13 is a schematic diagram for illustrating the gate width of a MOS transistor constituting the high-voltage decoder circuit of an embodiment of the present invention.

FIG. 12 is a circuit diagram showing the structure of the high-voltage decoder circuit 278 of the liquid crystal display of an embodiment of the present invention and FIG. 13 is a schematic view showing the gate width of a MOS transistor constituting the high-voltage decoder circuit 278 of the liquid crystal display of an embodiment of the present invention. In FIG. 12, symbol ○ denotes a MOS transistor and symbol ● denotes an NMOS transistor.

In the case of the high-voltage decoder circuit 278 shown in FIG. 10, MOS transistors to whose gates the same voltage is applied for each decoding row more continue for higher bits of display data. Therefore, even if the MOS transistors to whose gates the same voltage is applied for each column and which continue for each decoding row are replaced with one MOS transistor, there is no functional problem.

This embodiment is constituted by applying the same voltage to each column and replacing MOS transistors continuing for each decoding row with one MOS transistor. Moreover, in this embodiment, as shown in FIG. 13, letting the gate width of a minimum-size MOS transistor be W, the gate width of the MOS transistor at a high-order place of the minimum-size MOS transistor is set to 2W, the gate width of the MOS transistor at a higher-order place of the MOS transistor at the high-order place is set to 4W, and the gate width (W) of the MOS transistor (high-order-bit-side MOS transistor) to whose gate the high-order bit of display data is applied is set to two to the (m-j)-th power times the gate width of the minimum-size MOS transistor. In this case, m denotes the number of bits of the display data and j denotes the bit number of the most significant bit among the bits constituted of the minimum-size MOS transistor.

In this embodiment, letting the resistance of the minimum-size MOS transistor be R, the combined resistance of the MOS transistor of each decoding row is approx. 2R (≈R+R/2+R/4+R/8+R/16) for the decoder circuit 311 and approx. 2R (≈R+R/2+R/4+R/8) for the decoder circuit 312. FIG. 12 also illustrates the resistance of the MOS transistor of each place, when letting the resistance of the minimum-size MOS transistor be R.

In this case, for the high-voltage decoder circuit 278 shown in FIG. 10, letting the resistance of the minimum-size MOS transistor be R, the combined resistance of the MOS transistor of each decoding row is 5R (=R+R+R+R+R) for the decoder circuit 311 and 4R (=R+R+R+R) for the decoder circuit 312.

Therefore, in this embodiment, it is possible to reduce the combined resistance of the MOS transistor of each decoding row and allow a large discharge current to flow when redistributing charge to each capacitor constituting the second gradation voltage generation circuit 303. Thus, it is possible to increase the operation speed of the decoder circuit and equalize the combined resistance of the decoder circuit 311 with that of the decoder circuit 312. Thereby, it is possible to reduce the speed difference between two-level gradation.

Moreover, generally, in the case of a MOS transistor, the threshold voltage ($V_t$) is changed in the positive direction due to the substrate-source voltage ($V_{BS}$) and thereby, the drain current ($I_{DS}$) decreases. That is, the resistance of the MOS transistor increases.

Therefore, in this embodiment, as shown in FIG. 12, the PMOS transistor region is separated from the NMOS transistor region on both sides of the gradation voltage (gradation voltage V16 (or V18), V15 (or V17) in FIG. 12) equal to the substrate-source voltage ($V_{BS}$). Thereby, this embodiment makes it possible to prevent the resistance from increasing due to the substrate bias effect in the MOS transistor constituting the decoder circuit.

Figure 14:
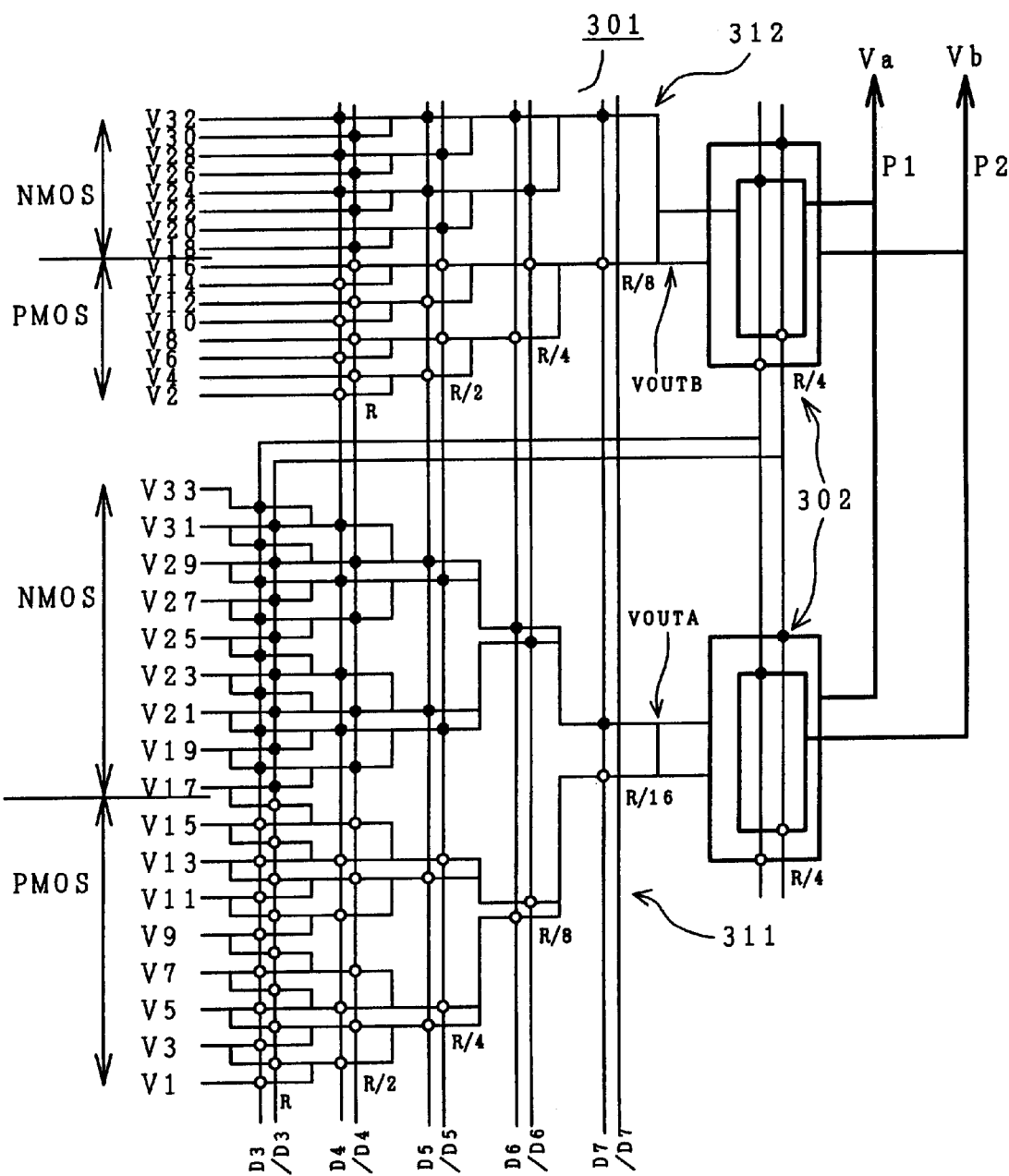
FIG. 14 is a circuit diagram showing the structure of the high-voltage decoder circuit of an embodiment of the present invention.

FIG. 14 is a circuit diagram showing the structure of a low-voltage decoder circuit 279 of the liquid crystal display of an embodiment of the present invention. As shown in FIG. 14, the low-voltage decoder circuit 279 can be constituted similarly to the high-voltage decoder circuit 278.

In the case of the low-voltage decoder circuit 279, however, when separating a PMOS transistor region from an NMOS transistor region on both sides of the gradation voltage (gradation voltage V16 (or V18), V15 (or V17) in FIG. 14) equal to the substrate-source voltage ($V_{BS}$), the PMOS transistor region and the NMOS transistor region are opposite to the case of the high-voltage decoder circuit 278. In this case, it is assumed that V1>V2>V3 . . . >32>V33.

Moreover, in each of the above embodiments, each MOS transistor constituting the decoder circuit 301 is a high-breakdown-voltage MOS transistor or a MOS transistor in which only the gate electrode portion has a high-breakdown-voltage structure. Moreover, the MOS transistor of the decoder circuit 301 on its low-order bit side can be a MOS transistor having a low drain-source breakdown voltage. In this case, it is possible to further downsize the decoder circuit 301.

Moreover, in the second gradation voltage generation circuit 303 resistors can be used instead of the capacitors. In this case, however, it is necessary to use resistors having high resistances and moreover, the magnitude relation between the resistances of the resistors must be opposite to that of the capacitors.

For example, in the case of the second gradation voltage generation circuit 303 shown in FIG. 8, when resistors are used instead of the capacitors, the resistances of the resistors replaced with the capacitors (C1) and (C3) must be two times the resistance of the resistor replaced with the capacitor (C2).

Figure 15:
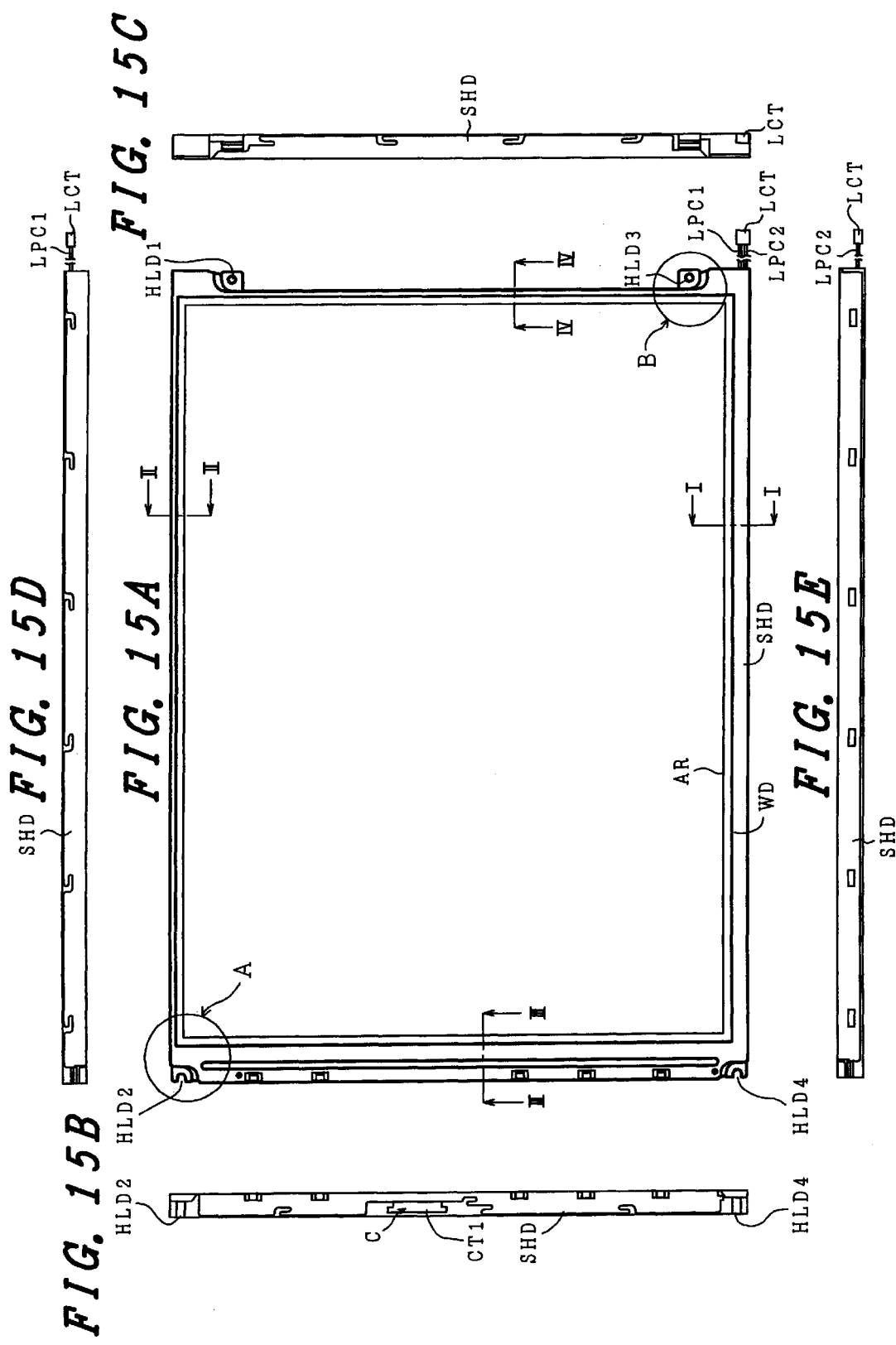
FIG. 15 is an illustration of the assembled liquid crystal display module of each of the above embodiments, showing a front view viewed from the display side of a liquid crystal display panel, a front side view, a right side view, a left side view, and a rear side view.
Figure 16:
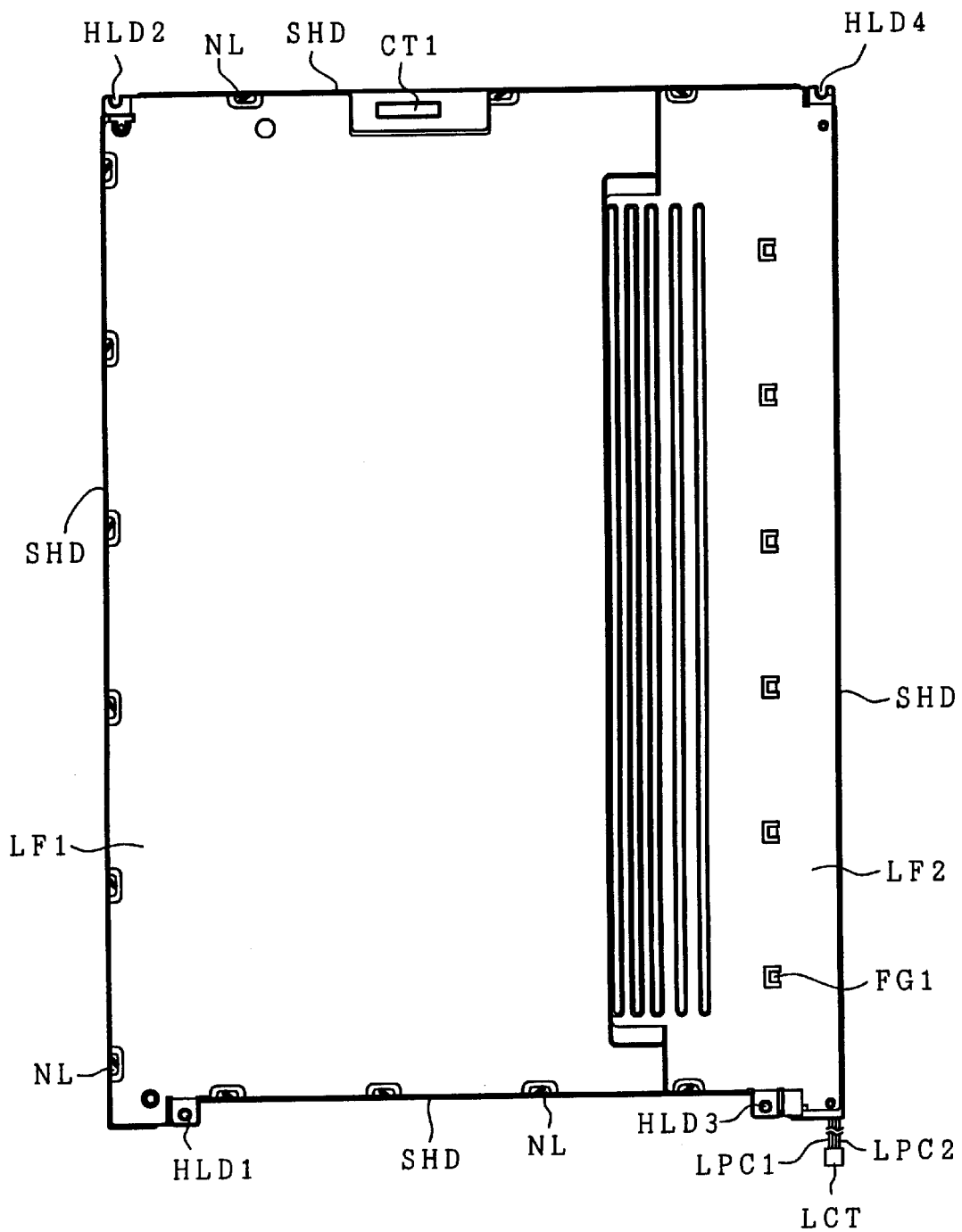
FIG. 16 is an illustration of the assembled liquid crystal display module of each of the above embodiments viewed from the rear side of a liquid crystal display panel.

FIG. 15 is an illustration of the assembled liquid crystal display of each of the above embodiment, in which a front view, front side view, right side view, left side view, and rear side view, viewed from the display surface side of the liquid crystal display panel, are shown. FIG. 16 is an illustrated of the assembled liquid crystal display of each embodiment, viewed from the back of the liquid crystal display panel.

The liquid crystal display of each of the above embodiments is provided with a mold case (ML) and a shield case (SHD). Symbols HLD1, HLD2, HLD3, and HLD4 denote fitting holes respectively formed in the mold case (ML) and the shield case (SHD). The liquid crystal display is mounted on a notebook computer by passing screws through these four fitting holes. An inverter circuit unit for driving a backlight is provided in a recess between the fitting holes (HLD1 and HLD2) to supply a driving voltage to a cold-cathode fluorescent lamp (LP) through a connector (LCT) and lamp cables (LCP1 and LCP2).

Display data, display control signals, and power from the computer body side are supplied to an interface section 100 through an interface connector (CT1) located at the back of the module.

FIG. 17(a) is a sectional view of the liquid crystal display shown in FIG. 15, taken along the line I—I of FIG. 15, and FIG. 17(b) is a sectional view of the liquid crystal display shown in FIG. 15, taken along the line II—II of FIG. 15. FIG. 18(a) is a sectional view of the liquid crystal display shown in FIG. 15, taken along the line III—III of FIG. 15 and FIG. 18(b) is a sectional view of the liquid crystal display shown in FIG. 15, taken along the line IV—IV of FIG. 15.

Figure 17:
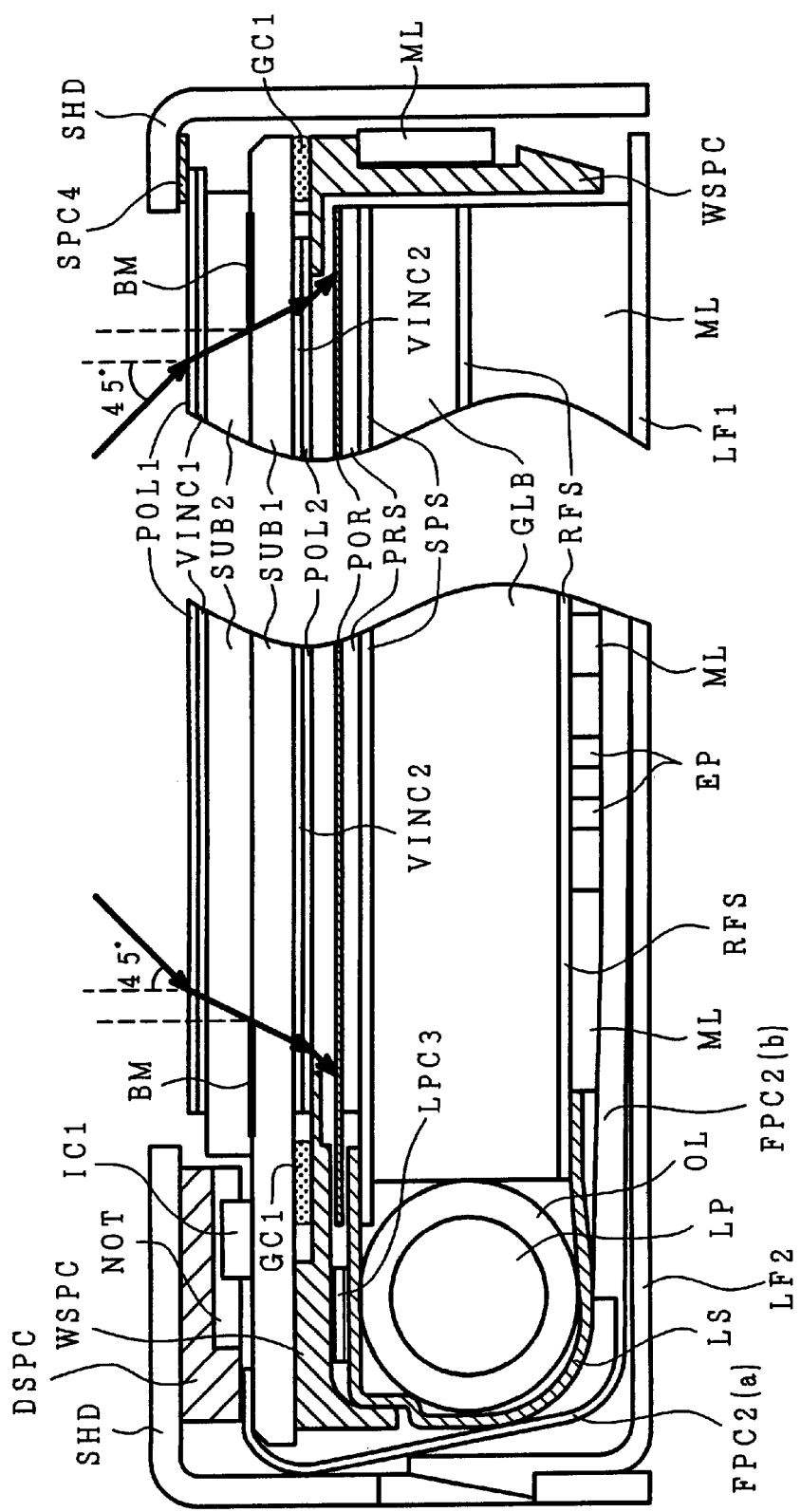
FIG. 17 shows a sectional view of the liquid crystal display module of FIG. 15, taken along the line I—I of FIG. 15 and a sectional view of the liquid crystal display module of FIG. 15, taken along the line II—II of FIG. 15.
Figure 18:
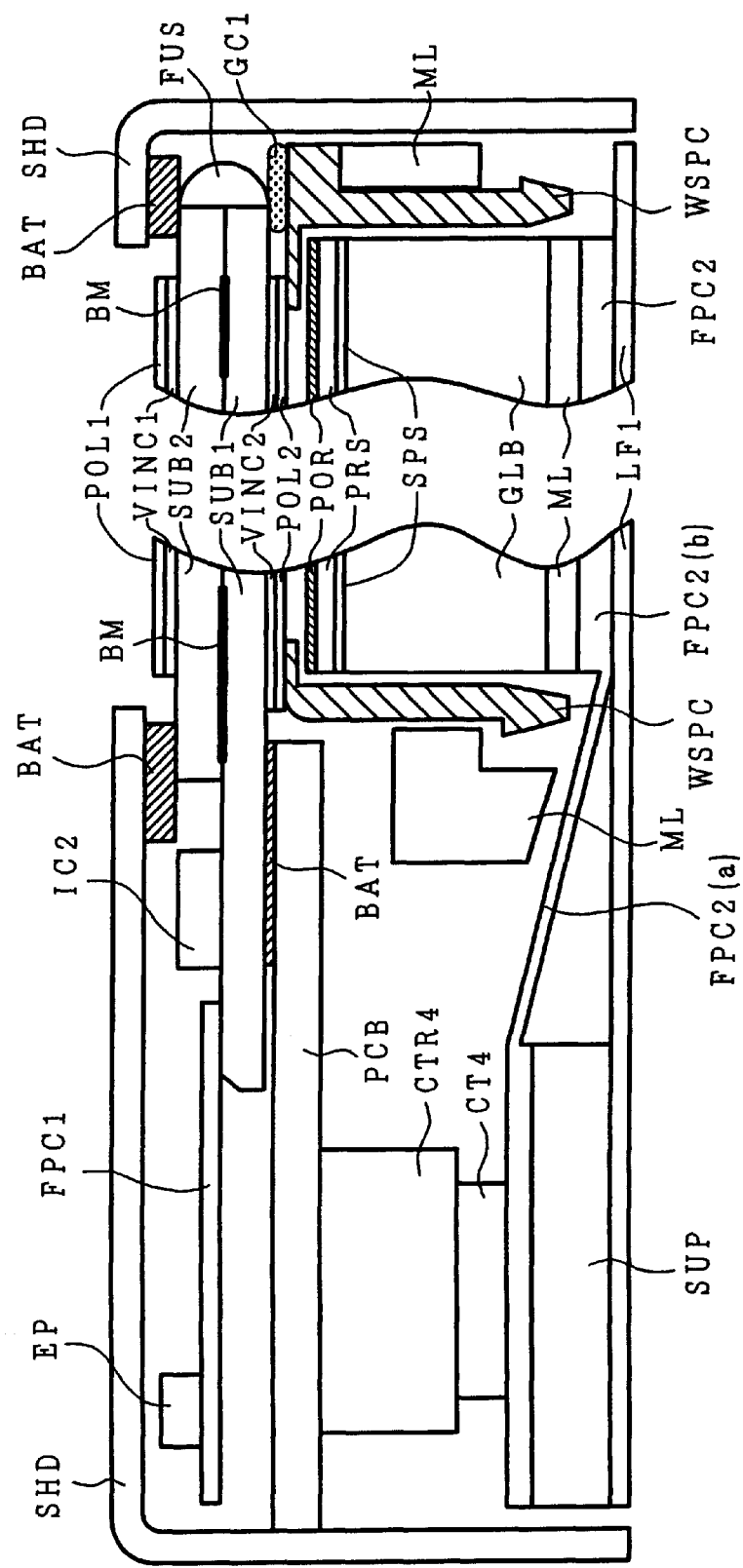
FIG. 18 shows a sectional view of the liquid crystal display module of FIG. 15, taken along the line III—III of FIG. 15 and a sectional view of the liquid crystal display module of FIG. 15, taken along the line IV—IV of FIG. 15.

In FIGS. 17 and 18, symbol SHD denotes a shield case (upper case) covering the peripheral part of the liquid crystal panel and the driving circuit of the liquid crystal display panel. Symbol ML denotes a mold case (lower case) where the backlight unit is housed. Symbols LF1 and LF2 denote first and second lower shield cases covering the lower case (ML).

Symbol WSPC denotes a frame spacer covering the periphery of the backlight unit. Symbols SUB1 and SUB2 denote glass substrates constituting the liquid crystal display panel. In FIG. 18, the glass substrate (SUB1) is a substrate on which thin-film transistors (TFT1 and TFT2) and a pixel electrode (IT01) are formed and the glass substrate (SUB2) is a substrate on which a color filter and a common electrode (IT02) are formed.

Symbol FUS denotes a sealing material, BM denotes an opaque film formed on the glass substrate (SUB2), POL1 denotes a top polarizing plate attached to the glass substrate (SUB2), POL2 denotes a bottom polarizing plate attached to the glass substrate (SUB1), VINC1 denotes a visual-field expansion film attached to the glass substrate (SUB2), and VINC2 denotes a visual-field expansion film attached to the glass substrate (SUB2).

In each of the above embodiments the dependence on the visual-field which is a problem peculiar to the liquid crystal panel that the contrast varies depending on the angle at which the user views the screen is eliminated by attaching the visual- field expansion films (VINC1 and VINC2) to the glass substrates (SUB1 and SUB2). It is possible to provided the visual-field expansion films (VINC1 and VINC2) outside the polarizing plates (POL1 and POL2). However, by providing the visual-field expansion films (VINC1 and VINC2) between the polarizing plates (POL1 and POL2) and the glass substrates (SUB1 and SUB2), it is possible to improve the visual-field expansion effect.

Symbol LP denotes a cold-cathode fluorescent lamp, LS denotes a lamp reflection sheet, GLB denotes a light guide plate, RFS denotes a reflection sheet, and SPS denotes a prism sheet. Symbol POR denotes a polarized-light reflection plate, which is used to improve the brightness of the liquid crystal display panel. The polarized-light reflection plate (POP) has a function of passing the light of only a specific polarization axis and reflecting the light of polarization axes other than the specific polarization axis. Therefore, by making the polarization axis of the light passing through the polarized-light reflection plate (POP) coincide with the polarizing axis of the bottom polarizing plate (POL2), the light which is conventionally absorbed by the bottom polarizing plate (POL2) is changed to the polarized light passing through the bottom polarizing plate (POL2) while the light reciprocates between the polarized-light reflection plate (POR) and the light guide plate (GLB) and emitted from the polarized-light reflection plate (POR). Therefore, it is possible to improve the contrast of the liquid crystal display panel.

The frame spacer (WSPC) firmly presses the light-guiding plate (GLB) to the mold case (ML) by holding the periphery of the light guide plate (GLB) and inserting the hook of the frame spacer (WSPC) into the hole of the mold case (ML) to prevent the light guide plate (GLB) from colliding with the liquid crystal display panel. Moreover, because a diffusion sheet (SPS), the prism sheet (PRS), and the polarized-light refection plate (POR) are also held by the frame spacer (WSPC), it is possible to mount the backlight unit on the liquid crystal display module without deforming the diffusion sheet (SPS), prism sheet (PRS), and polarized-light reflection plate (POR).

Symbol GC1 denotes a rubber cushion disposed between the frame spacer (WSPC) and the glass substrate (SUB1). Symbol LPC3 denotes a lamp cable for supplying a driving voltage to the cold-cathode fluorescent lamp (LP), which is a flat cable so as to minimize its mounting space and disposed between the frame spacer (WSPC) and the lamp reflection sheet (LS). The lamp cable (LPC3) is attached to the reflection sheet (LS) by a double-sided adhesive tape. Therefore, when replacing the cold-cathode fluorescent lamp (LP), it is possible to replace it together with the lamp reflection sheet (LS). Therefore, it is unnecessary to remove the lamp cable (LPC3) from the lamp reflection sheet (LS) and it is easy to replace the cold-cathode fluorescent lamp (LP).

Symbol OL denotes an O-ring, which serves as a cushion between the cold-cathode fluorescent lamp (LP), and the lamp reflection sheet (LS). The O-ring (OL) is made of synthetic resin for preventing the luminance of the cold-cathode fluorescent lamp (LP) from deteriorating. Moreover, in order that the O-ring (OL) may prevent a high-frequency current from leaking from the cold-cathode fluorescent lamp (LP), it is made of an insulating material having a low permittivity. Furthermore, the O-ring serves as a cushion for preventing the cold-cathode fluorescent lamp (LP) from colliding with the light guide plate (GLB).

Symbol IC1 denotes a semiconductor chip constituting the drain driver 130 for supplying the video signal voltage to the drain signal line (D) of the liquid crystal display panel 10, which is mounted on the glass substrate (SUB1). Because the semiconductor chip (IC1) is mounted only on one side of the glass substrate (SUB1), it is possible to decrease the size of the frame region of the opposite side to the side on which the semiconductor chip (IC1) is mounted. Moreover, because the cold-cathode fluorescent lamp (LP) and lamp reflection sheet (LS) are so arranged as to be superposed on each other below the portion, on which the semiconductor chip (IC1) is mounted, of the glass substrate (SUB1), it is possible to compactly store the cold-cathode fluorescent lamp (LP) and the lamp reflection sheet (LS) in the liquid crystal display.

Symbol IC2 denotes a semiconductor chip constituting the gate driver 140 for supplying the scan driving voltage to the gate signal line (G) of the liquid crystal display panel 10, which is mounted on the glass substrate (SUB1). Because the semiconductor chip (IC2) is also mounted on only one side of the glass substrate (SUB1), it is possible to decrease the size of the frame region of the opposite side to the side on which the semiconductor chip (IC2) is mounted.

Symbol FPC1 denotes a flexible printed circuit board on the gate signal line side, which is connected to the external terminals of the glass substrate (SUB1) by an anisotropic conductive film to supply power and the driving signal to the semiconductor chip (IC2). Symbol FPC2 denotes a flexible printed circuit board on the drain signal line side, which is connected to the external terminals of the glass substrate (SUB1) to supply power and the driving signal to the semiconductor chip (IC1). Chip parts (EP) such as resistors and capacitors are mounted on the flexible printed circuit boards (FPC1 and FPC2).

In the case of each of the above embodiments, in order to reduce the frame area of the liquid crystal panel 10, the flexible printed circuit board (FPC2) is so bent as to enclose the lamp reflection sheet (LS), and a part (portion b) of the flexible printed circuit board (FPC2) is secured between the mold case (ML) and the second shield case at the back of the backlight unit. Therefore, the mold case (ML) is provided with a cutout for ensuring the space for chip parts (EP) mounted on the flexible printed circuit board (FPC2).

The flexible printed circuit board (FPC2) is constituted of a thin portion (portion a) where it is easily bent and a thick portion (portion b) for multilayer wiring. Moreover, in the case of each of the above embodiments, the lower shield case is constituted of the first lower shield case (LF1) and the second lower shield case (LF2) so as to cover the back of the liquid crystal display module. Therefore, by removing the second lower shield case (LF2), it is possible to expose the reflection sheet (LS). Therefore, it is easy to replace the cold-cathode fluorescent lamp (LP).

Symbol PCB denotes an interface board on which the display controller 110 and the power supply circuit 120 are mounted, which is also constituted of a multilayer printed circuit board. In the case of each of the above embodiments, in order to reduce the frame area of the liquid crystal panel 10, the interface board (PCB) is so arranged as to be superposed on each other below the flexible printed circuit board (FPC1) and bonded to the glass substrate (SUB1) by a double-sided adhesive tape (BAT).

The interface board (PCB) is provided with a connector (CTR3) and a connector (CTR4). The connector (CTR4) is electrically connected with the connector (CT3) of the flexible printed circuit board (FPC2). Similarly, the connector (CTR3) is electrically connected with the connector (CT3) of the flexible printed circuit board (FPC1).

Figure 19:
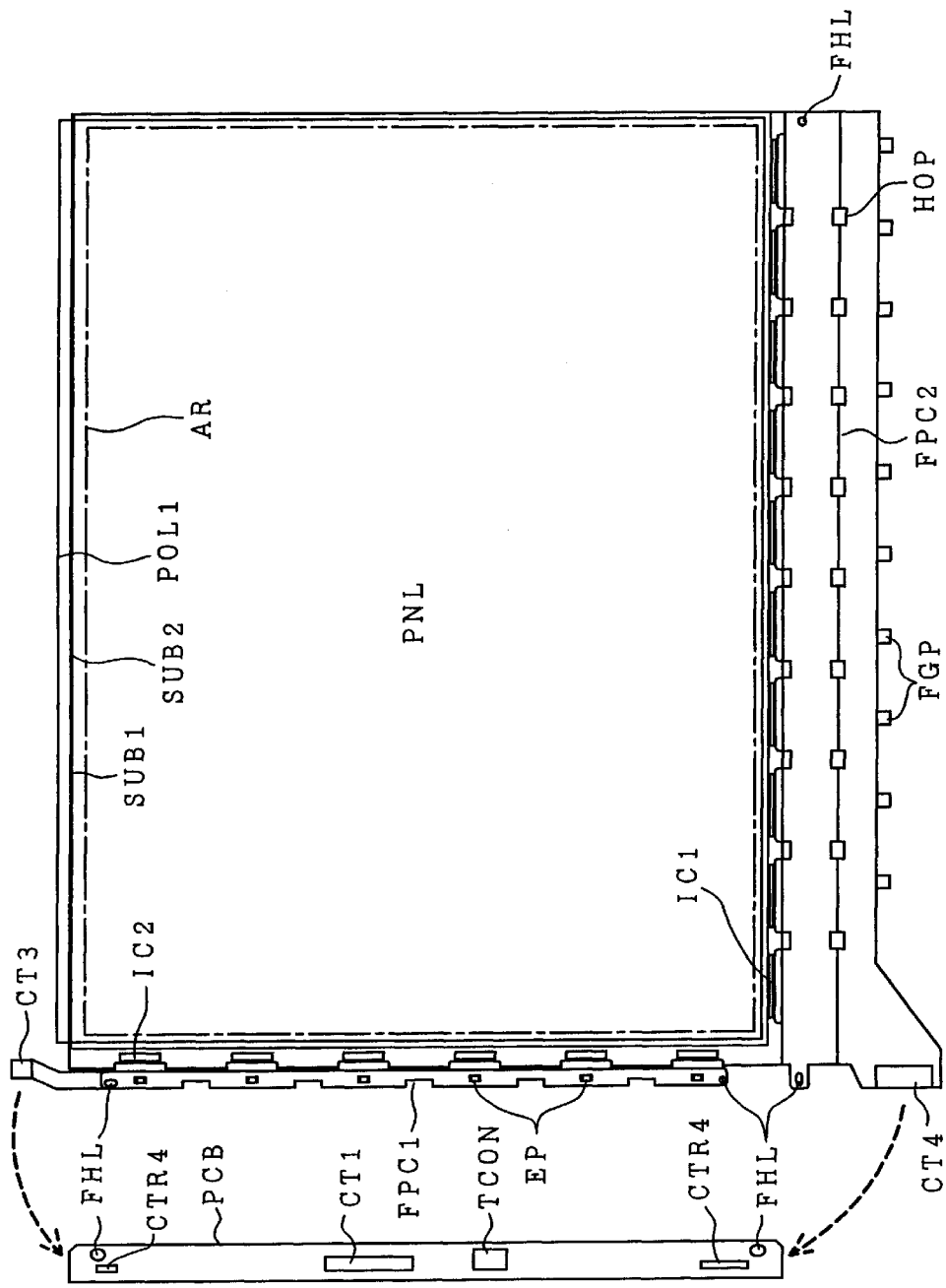
FIG. 19 is an illustration showing a flexible printed circuit board (FPC1) and a flexible printed circuit board (FPC2), before bent, mounted around a liquid crystal display panel of the liquid crystal display module of each of the embodiments.

FIG. 19 is an illustration showing the flexible printed circuit board (FPC1) and the flexible printed circuit board (FPC2) before bent which are mounted around the liquid crystal display panel 10. Moreover, FIG. 20 is an enlarged view of the portion where the liquid crystal display panel 10 is connected with the flexible printed circuit boards (FPC1 and FPC2) in FIG. 19.

Figure 20:
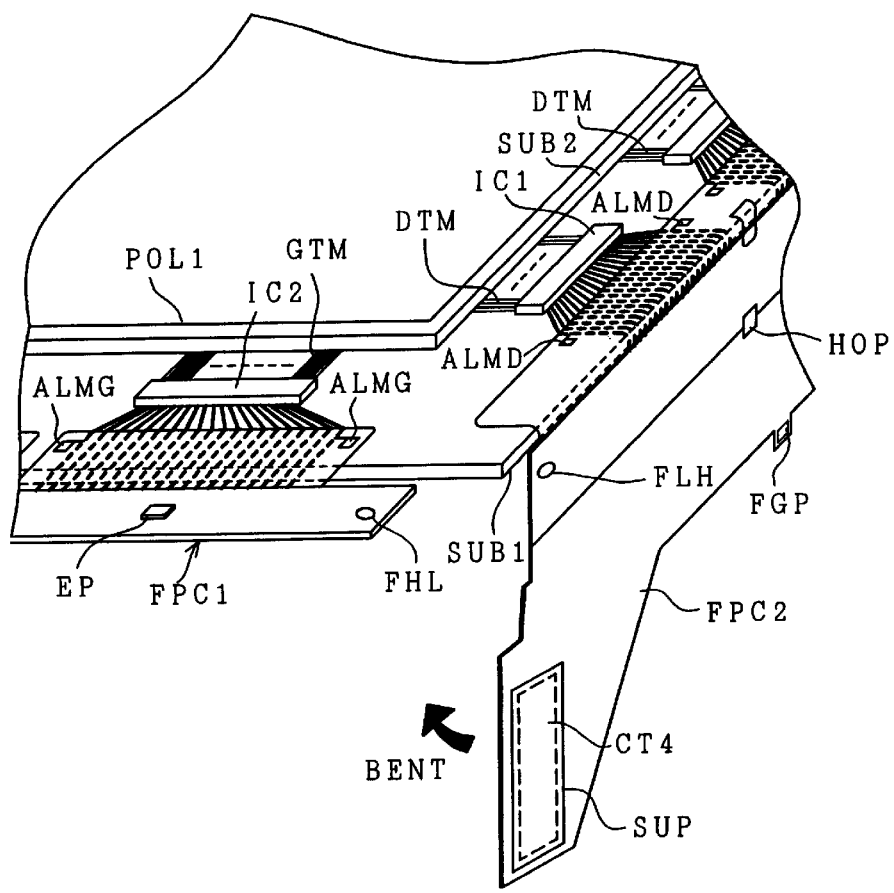
FIG. 20 is an enlarged view of the joint between the liquid crystal display panel and the flexible printed circuit boards (FPC1 and FPC2) of FIG. 19.

In FIGS. 19 and 20, symbol TCON denotes a semiconductor chip constituting the display controller 110, DTM denotes a drain terminal, and GTM denotes a gate terminal.

In FIGS. 17 and 18, symbol SUB denotes a reinforcing plate that is disposed between the lower shield case (LF1) and the connector (CT4) to prevent the connector (CT4) from coming off the connector (CTR4). Symbol SPC4 denotes a spacer provided between the shield case (SHD) and the top polarizing plate (POL1), which is made of nonwoven fabric and attached to the shield case (SHD) by an adhesive.

In the case of each of the above embodiments, the top polarizing plate (POL1) and the visual-field expansion film (VINC1) are led from the glass substrate (SUB2) to hold the top polarizing plate (POL1) and the visual-field expansion film (VINC1) by the shield case (SHD). Each of the above embodiments is ensured to have a sufficient strength by adopting the above structure even if the frame region is decreased in size.

Symbol DSPC denotes a drain spacer which is provided between the shield case (SHD) and the glass substrate (SB1) to prevent the shield case (SHD) from colliding with the glass substrate (SUB1). Moreover, because the drain spacer (DSPC) is so provided as to cover the semiconductor chip (IC1), a notch (NOT) is formed in the portion of the semiconductor chip (IC1). Thereby, the shield case (SHD) and drain spacer (DSPC) do not collide with the semiconductor chip (IC1). Furthermore, because the drain spacer (DSPC) holds the flexible printed circuit board (FPC2) over the external connection terminals of the glass substrate (SUB1), it prevents the flexible printed circuit board (FPC2) from separating from the glass substrate (SUB1). Symbol FUS denotes a sealing material for sealing the liquid crystal filling port of the liquid crystal display panel.

The invention made by the present inventor has been specifically described above in conjunction with the above embodiments of the present invention. However, the present invention is not restricted to the above embodiments of the present invention. It is matter of course that various modifications of the present invention are allowed as long as they are not deviated from the gist of the present invention.

In the above embodiments, it is possible to decrease the total number of switching devices of the decoding circuit and decrease the chip size of video signal line driving means.

Thereby it is possible to generate gradation voltages for multilevel gradation such as 256-level gradation without increasing the chip size of the video signal line driving means.

What is claimed is:

1. A liquid crystal display device comprising:
   a liquid crystal panel having a plurality of pixels;
   a driving circuit for applying a video signal voltage to each of the pixels in accordance with display data, said driving circuit including a first circuit, a second circuit, and a switching circuit;
   wherein said first circuit outputs a first voltage and a second voltage from one display data value, said first voltage being output to a first output terminal, and said second voltage being output to a second output terminal;
   wherein said second circuit includes a first input terminal and a second input terminal into which said first voltage and said second voltage are input, and outputs one of a plurality of voltages that are generated from said first voltage and said second voltage; and
   wherein said switching circuit changes between a first connection and a second connection, said first connection connecting said first output terminal to said first input terminal and connecting said second output terminal to said second input terminal, and said second connection connecting said first output terminal to said second input terminal and connecting said second output terminal to said first input terminal.

2. The liquid crystal display device according to claim 1, wherein said second circuit generates a plurality of voltages from the first and second voltages by using a plurality of capacitors.

3. A liquid crystal display device comprising:
   a liquid crystal panel having a plurality of pixels arranged like a matrix; and
   a driving circuit for applying a video signal voltage to each of the pixels in accordance with display data;
   wherein the driving circuit includes a first circuit for outputting a first voltage to a first output terminal and a second voltage to a second output terminal in accordance with one display data value;

a second circuit having a first input terminal and a second input terminal for receiving the first and second voltages and outputting one of a plurality of voltages generated from the first and second voltages;

a first connection that connects said first output terminal to said first input terminal and connects said second output terminal to said second input terminal;

a second connection that connects said first output terminal to said second input terminal and connects said second output terminal to said first input terminal; and a switching circuit which changes between said first connection and said second connection.

4. The liquid crystal display device according to claim 3, wherein said switching circuit provides a higher voltage of the first and second voltages at the first input terminal and a lower voltage of the first and second voltages at the second input terminal.

5. A liquid crystal display device comprising:

a liquid crystal panel having a plurality of pixels arranged like a matrix;

a driving circuit for applying a video signal voltage to each of the pixels in accordance with m-bit display data, wherein
the driving circuit is constituted of a first voltage generation circuit for generating $(2n+1)$ (where $2 \leq n \leq m$) first gradation voltages;

a second voltage generation circuit for receiving two voltages outputted by the first voltage generation circuit in accordance with high-order n-bit data of the m-bit display data and outputting one of a plurality of voltages generated from the two voltages outputted by the first voltage generation circuit in accordance with low-order (m-n)-bit data of the m-bit display data; and a switching circuit which changes a connection between said first voltage generation circuit and said second voltage generation circuit.

6. A liquid crystal display device comprising a liquid crystal panel having a plurality of pixels arranged like a matrix and a driving circuit for applying a video signal voltage to each of the pixels in accordance with m-bit display data; wherein the driving circuit is constituted of a first voltage generation circuit for generating $(2n+1)$ (where $2 \leq n \leq m$) first gradation voltages and outputting two voltages in accordance with high-order n-bit data of the m-bit display data;

a second voltage generation circuit for receiving two voltages outputted by the first voltage generation circuit at a first input terminal and a second input terminal and outputting one of a plurality of voltages generated from the two voltages output by the first voltage generation circuit in accordance with low-order (m-n)-bit data of the m-bit display data; and a switching circuit which provides a higher voltage output of the two voltages outputted by the first voltage generation circuit at the first input terminal and provides a lower voltage output of the two voltages at the second input terminal.

7. The liquid crystal display device according to claim 6, wherein the second voltage generation circuit generates a plurality of voltages from the two voltages outputted by the first voltage generation circuit by using a plurality of capacitors.

* * * * *